United States Patent
Oh

(10) Patent No.: US 11,790,963 B2
(45) Date of Patent: Oct. 17, 2023

(54) ELECTRONIC DEVICE INCLUDING NEAR-MEMORY SUPPORTING MODE SETTING, AND METHOD OF OPERATING THE SAME

(71) Applicant: SAMSUNG ELECTRONICS CO., LTD., Suwon-si (KR)

(72) Inventor: Ki-Seok Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 17/708,414

(22) Filed: Mar. 30, 2022

(65) Prior Publication Data

US 2023/0044654 A1 Feb. 9, 2023

(30) Foreign Application Priority Data

Aug. 4, 2021 (KR) .................. 10-2021-0102389

(51) Int. Cl.
| | |
|---|---|
| *G11C 7/22* | (2006.01) |
| *G11C 7/10* | (2006.01) |
| *G06F 13/16* | (2006.01) |
| *G11C 5/14* | (2006.01) |
| *G06F 12/0811* | (2016.01) |

(52) U.S. Cl.
CPC .......... *G11C 7/222* (2013.01); *G06F 12/0811* (2013.01); *G06F 13/1668* (2013.01); *G11C 5/14* (2013.01); *G11C 7/1045* (2013.01); *G11C 7/1057* (2013.01); *G11C 7/1084* (2013.01)

(58) Field of Classification Search
CPC ......... G11C 7/222; G11C 5/14; G11C 7/1045; G11C 7/1057; G11C 7/1084; G11C 7/1066; G11C 7/1093; G11C 5/025; G11C 2207/2227; G11C 2207/2272; G06F 12/0811; G06F 13/1668; G06F 3/0634; G06F 3/061; G06F 3/0625; G06F 3/0658; G06F 12/0842; G06F 13/1694; Y02D 10/00
See application file for complete search history.

(56) References Cited

U.S. PATENT DOCUMENTS

| | | | |
|---|---|---|---|
| 8,492,828 B2 | 7/2013 | Son et al. | |
| 8,830,716 B2 | 9/2014 | Feekes | |
| 9,032,099 B1* | 5/2015 | Parra ................... | G06F 12/0804 |
| | | | 710/1 |
| 9,342,453 B2 | 5/2016 | Nale et al. | |
| 9,600,413 B2* | 3/2017 | Ray ....................... | G06F 3/0655 |

(Continued)

*Primary Examiner* — Ajay Ojha
(74) *Attorney, Agent, or Firm* — Sughrue Mion, PLLC

(57) ABSTRACT

An electronic device includes: a system-on-chip (SoC) including a processor, a near-memory controller controlled by the processor, and a far-memory controller controlled by the processor; a near-memory device including a first memory channel configured to communicate with the near-memory controller and operate in a first mode of a plurality of modes, and a second memory channel configured to communicate with the near-memory controller and operate in a second mode different from the first mode from among the plurality of modes; and a far-memory device configured to communicate with the far-memory controller. The first memory channel is further configured to, based on a command from the near-memory controller, change an operation mode from the first mode to the second mode.

20 Claims, 15 Drawing Sheets

(56) References Cited

U.S. PATENT DOCUMENTS

| | | |
|---|---|---|
| 9,754,955 B2 | 9/2017 | Wu et al. |
| 10,503,655 B2 | 12/2019 | Meswani et al. |
| 10,691,626 B2 | 6/2020 | Nale et al. |
| 10,769,748 B2 | 9/2020 | Nurvitadhi et al. |
| 2020/0350213 A1 | 11/2020 | Ramkumar et al. |

* cited by examiner

FIG. 6

| Index | System Mode | Voltage | Speed | Latency | Remark |
|---|---|---|---|---|---|
| Mode1 | Memory mode | VDDH | 1x | 1x | Default mode |
| Mode2 | Memory mode | VDDH | 1.2x | 1x | High speed memory mode |
| Mode3 | Memory mode | VDDH | 1x | 0.8x | Low latency memory mode |
| Mode4 | Memory mode | VDDL1 | 1x | 1.1x | Low power memory mode |
| Mode5 | Memory mode | VDDL2 | 1x | 1.3x | Extreme low power memory mode |
| Mode6 | Cache Mode | VDDH | 1.2x | 1x | High speed cache mode |
| Mode7 | Cache Mode | VDDH | 1x | 0.8x | Low latency cache mode |
| Mode8 | Cache Mode | VDDL1 | 1x | 1.1x | Low power cache mode |
| Mode9 | Cache Mode | VDDL2 | 1x | 1.3x | Extreme low power cache mode |

ELECTRONIC DEVICE INCLUDING NEAR-MEMORY SUPPORTING MODE SETTING, AND METHOD OF OPERATING THE SAME

CROSS-REFERENCE TO RELATED APPLICATION(S)

This application claims priority under 35 U.S.C. § 119 to Korean Patent Application No. 10-2021-0102389 filed on Aug. 4, 2021, in the Korean Intellectual Property Office, the disclosures of which are incorporated by reference herein in their entireties.

BACKGROUND

Embodiments of the present disclosure described herein relate to architecture of an electronic device including a memory device, and more particularly, relate to an electronic device including a near-memory supporting mode setting, and an operating method thereof.

An electronic device may include a processor that performs calculation and/or computation and a memory device that stores a result of the calculation and/or computation. The memory device stores data in response to a write request and outputs data stored therein in response to a read request. For example, the memory device includes a volatile memory device, which loses data stored therein when a power supply is turned off, such as a dynamic random access memory (DRAM) device or a static RAM (SRAM) device, and a non-volatile memory device, which retains data stored therein even when a power supply is turned off, such as a flash memory device, a phase-change RAM (PRAM), a magnetic RAM (MRAM), or a resistive RAM (RRAM).

Nowadays, the number of calculations/computations to be performed by the processor of the electronic device is increasing, and sizes and types thereof are being diversified. A memory device of a fast data processing speed or a high-capacity memory device may be required depending on a size and a type of calculation/computation. Because a resource of the electronic device is limited, it may be difficult to allocate a high-capacity and high-speed memory device for all calculations/computations. A technique for controlling memory channels of a memory device is needed for overall efficiency of a system, an increase in a processing speed, a decrease in power consumption, and memory support of various layers.

SUMMARY

Embodiments of the present disclosure provide an electronic device including a near-memory supporting mode setting, and an operating method thereof.

According to an aspect of an example embodiment, an electronic device includes a system-on-chip (SoC) including a processor, a near-memory controller controlled by the processor, and a far-memory controller controlled by the processor; a near-memory device including a first memory channel configured to communicate with the near-memory controller and operate in a first mode of a plurality of modes, and a second memory channel configured to communicate with the near-memory controller and operate in a second mode different from the first mode from among the plurality of modes; and a far-memory device configured to communicate with the far-memory controller, wherein the first memory channel is further configured to, based on a command from the near-memory controller, change an operation mode from the first mode to the second mode.

According to an aspect of an example embodiment, an electronic device includes a system-on-chip (SoC) that includes a processor, a first memory controller controlled by the processor, and a second memory controller controlled by the processor; a first memory device including a first memory channel configured to operate in a first cache mode and communicate with the first memory controller, and a second memory channel configured to operate in a first memory mode and communicate with the first memory controller; and a second memory device configured to communicate with the second memory controller, wherein the first memory channel is further configured to, based on a command from the first memory controller, change an operation mode from the first cache mode to the first memory mode.

According to an aspect of an example embodiment, a method of operating an electronic device is provided, the electronic device including a near-memory device, a far-memory device, and a system-on-chip (SoC) configured to communicate with the near-memory device and the far-memory device. The method includes: performing power-up of the near-memory device; providing, by the SoC, a first mode register write (MRW) command indicating a first mode to a first memory channel, during the power-up; providing, by the SoC, a second mode register write (MRW) command indicating a second mode different from the first mode to a second memory channel, during the power-up; using the first memory channel, which is set to the first mode based on the first MRW command, as a cache memory; using the second memory channel, which is set to the second mode based on the second MRW command, as a main memory; and changing an operation mode of the first memory channel used as the cache memory from the first mode to the second mode.

BRIEF DESCRIPTION OF THE FIGURES

The above and other objects and features of the present disclosure will become apparent by describing in detail example embodiments thereof with reference to the accompanying drawings.

FIG. 6 is a table describing operation modes of a memory channel according to some embodiments of the present disclosure.

DETAILED DESCRIPTION

Below, example embodiments of the present disclosure will be described in detail and clearly to such an extent that one skilled in the art easily carries out the present disclosure.

Components described in the detailed description with reference to terms "part", "unit", "module", "layer", etc. and function blocks illustrated in drawings may be implemented in the form of software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
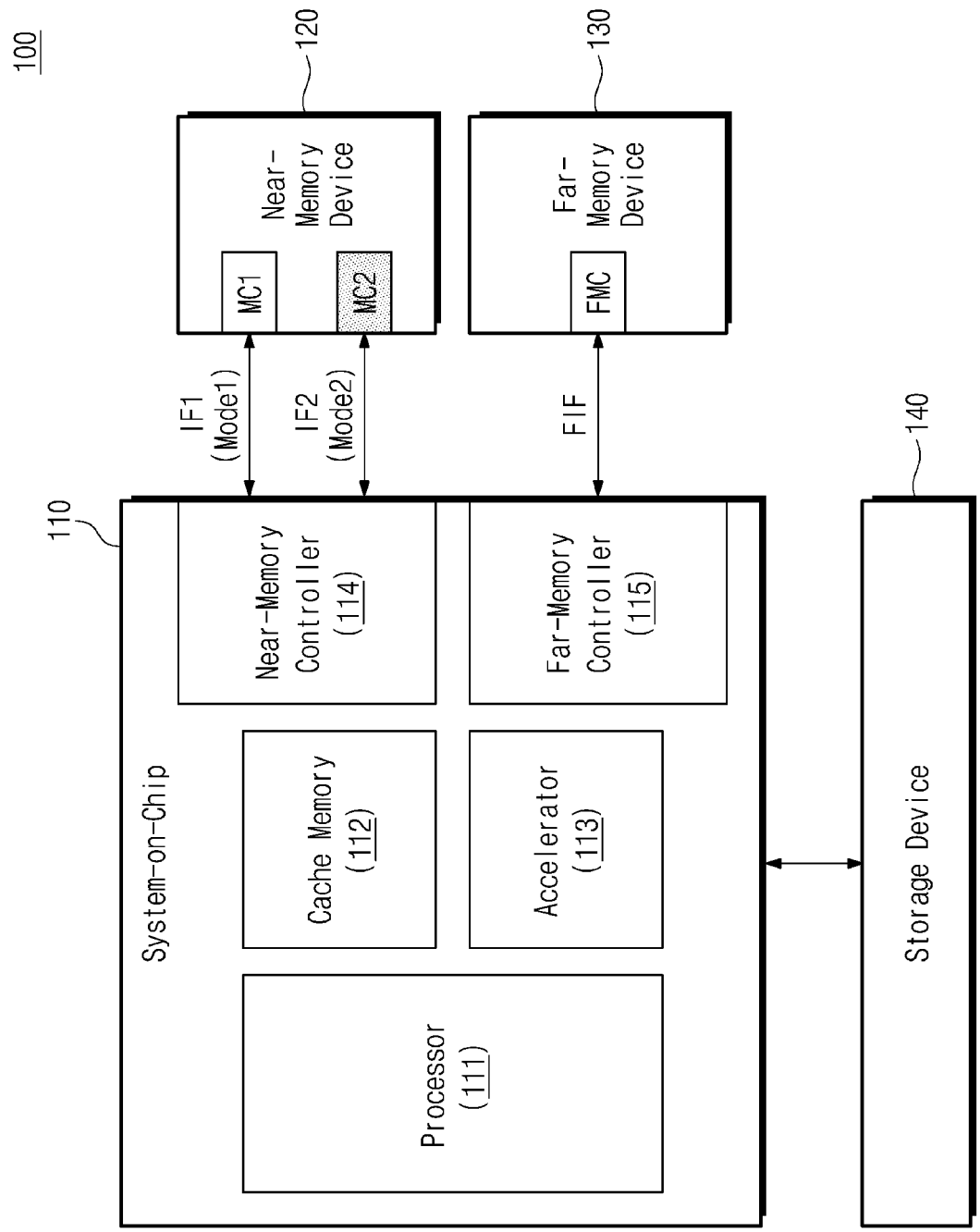
FIG. 1 is a block diagram of an electronic device according to an embodiment of the present disclosure.

FIG. 1 is a block diagram of an electronic device according to an embodiment of the present disclosure. Referring to FIG. 1, an electronic device 100 may include a system on chip (SoC) 110, a near-memory device 120, a far-memory device 130, and a storage device 140. The electronic device 100 may be a computing system, which is configured to process a variety of information, such as a personal computer (PC), a notebook, a laptop, a server, a workstation, a tablet PC, a smartphone, a digital camera, and a black box.

The SoC 110 may include a processor 111, a cache memory 112, an accelerator 113, a near-memory controller 114, and a far-memory controller 115. The SoC 110 may mean a chip in which various kinds of circuits and modules for different operations, calculations, and/or computations are implemented on one integrated circuit. The SoC 110 may communicate with the near-memory device 120, the far-memory device 130, and the storage device 140.

The processor 111 may control an overall operation of the SoC 110. The cache memory 112 may operate as a buffer memory for a high-speed operation of the processor 111. For example, an operating speed of the processor 111 may be faster than data input/output (I/O) speeds of external memories of the SoC 110, such as the near-memory device 120, the far-memory device 130, and the storage device 140. To alleviate the bottleneck due to a speed difference of the processor 111 and the external memories of the SoC 110, the cache memory 112 may provide a high-speed buffer memory that assists an operation of the processor 111.

The accelerator 113 may assist the operation of the processor 111. For example, the accelerator 113 may be separate hardware for performing graphics processing, machine learning, neural network calculation, and the like.

The near-memory controller 114 may control an overall operation of the near-memory device 120. Under control of the processor 111, the near-memory controller 114 may store data in the near-memory device 120 or may read data stored in the near-memory device 120.

The far-memory controller 115 may control an overall operation of the far-memory device 130. Under control of the processor 111, the far-memory controller 115 may store data in the far-memory device 130 or may read data stored in the far-memory device 130.

The near-memory device 120 may communicate with the near-memory controller 114 to store data or to output the stored data. For example, the near-memory device 120 may be a volatile memory device such as a dynamic random access memory (DRAM). The near-memory device 120 may be included in the same package as the SoC 110. The near-memory device 120 may be physically closer to the SoC 110 than the far-memory device 130 and may be excellent in terms of a low latency and a high-speed data I/O.

The near-memory device 120 may include a first memory channel MC1 and a second memory channel MC2. To avoid a complicated drawing, the near-memory device 120 is illustrated as including only the first and second memory channels MC1 and MC2, but the present disclosure is not limited thereto. For example, the number of memory channels included in the near-memory device 120 may be any number other than two and may increase or decrease.

The first memory channel MC1 may communicate with the near-memory controller 114 through a first interface IF1. The first interface IF1 may provide the transmission of electrical signals such as a command, an address, data, and a clock between the first memory channel MC1 and the near-memory controller 114. The first interface IF1 may comply with a low power double data rate (LPDDR) standard, but the present disclosure is not limited thereto. For example, the first interface IF1 may comply with a standard that is appropriate for a kind and an implementation of the electronic device 100.

The first memory channel MC1 may operate in a first mode under control of the near-memory controller 114. The first mode may be one of various operation modes that the first memory channel MC1 supports. For example, the first mode may define the following in association with an operation of the first memory channel MC1: a level of a memory layer (e.g., a level of a main memory layer or a level of a cache memory layer), a kind of a power supply voltage, a frequency multiplication of a data clock, and a time multiplication of a latency parameter. The mode will be described in more detail with reference to FIGS. 5 and 6 later.

In some embodiments, the first memory channel MC1 may operate in a second mode different from the first mode. For example, unlike the embodiment illustrated in FIG. 1, the near-memory controller 114 may change an operation mode of the first memory channel MC1 from the first mode to the second mode through the first interface IF1. The first memory channel MC1 whose operation mode is changed to the second mode may operate in the second mode. That is, the first memory channel MC1 may support a plurality of operation modes, and the near-memory controller 114 may control an operation mode of the first memory channel MC1.

The second memory channel MC2 may communicate with the near-memory controller 114 through a second interface IF2. The second interface IF2 may provide the transmission of electrical signals such as a command, an address, data, and a clock between the second memory channel MC2 and the near-memory controller 114. The second interface IF2 may be controlled independently of the first interface IF1. The second interface IF2 may comply with a standard that is appropriate for a kind and an implementation of the electronic device 100.

The second memory channel MC2 may operate in the second mode under control of the near-memory controller 114. The second mode may be different from the first mode. The second mode may be one of various operation modes that the second memory channel MC2 supports. For example, the second mode may define the following in association with an operation of the second memory channel MC2: a level of a memory layer, a kind of a power supply voltage, a frequency multiplication of a data clock, and a time multiplication of a latency parameter.

In some embodiments, the first memory channel MC1 and the second memory channel MC2 may be implemented to be symmetrical with each other. For example, the first memory channel MC1 may support both the first mode and the second mode. The second memory channel MC2 may support both the first mode and the second mode. Each of the first and second memory channels MC1 and MC2 may operate in the first mode or the second mode under control of the near-memory controller 114.

In some embodiments, the first memory channel MC1 and the second memory channel MC2 may be implemented to be asymmetrical with each other. For example, the first memory channel MC1 may support both the first mode and the second mode. The second memory channel MC2 may support the second mode but may not support the first mode. Asymmetrically implemented memory channels will be described in more detail with reference to FIGS. 11 and 12.

The far-memory device 130 may communicate with the far-memory controller 115 to store data or to output the stored data. For example, the far-memory device 130 may be a volatile memory device such as a DRAM. The far-memory device 130 may be included in a package different from the package of the SoC 110. The far-memory device 130 may be physically more distant from the SoC 110 than the near-memory device 120 and may be excellent in terms of additional connection and expansion.

The far-memory device 130 may include a far-memory channel FMC. To avoid a complicated drawing, the far-memory device 130 is illustrated as including one far-memory channel FMC, but the present disclosure is not limited thereto. For example, the number of far-memory channels included in the far-memory device 130 may be any number other than one and may increase or decrease.

The far-memory channel FMC may communicate with the far-memory controller 115 through a far-interface FIF. The far-interface FIF may provide the transmission of electrical signals such as a command, an address, data, and a clock between the far-memory channel FMC and the far-memory controller 115. The far-interface FIF may comply with a standard that is appropriate for a kind and an implementation of the electronic device 100. In the case where another far-memory channel is added to the far-memory device 130, the far-memory controller 115 may further provide another far-interface for communication with another far-memory channel.

In some embodiments, the near-memory device 120 and the far-memory device 130 may be manufactured by different processes. For example, a latency of the near-memory device 120 may be lower than that of the far-memory device 130, and a data I/O speed of the near-memory device 120 may be higher than that of the far-memory device 130. However, a storage capacity of the near-memory device 120 may be smaller in size than that of the far-memory device 130. The near-memory device 120 may be manufactured in a logic process. For another example, a storage capacity of the far-memory device 130 may be larger than that of the near-memory device 120. However, a latency of the far-memory device 130 may be higher than that of the near-memory device 120, and a data I/O speed of the far-memory device 130 may be lower than that of the near-memory device 120. The far-memory device 130 may be manufactured in a legacy process.

However, the present disclosure is not limited thereto. For example, the logic process and the legacy process may be used together for each memory channel of the near-memory device 120, which will be described in detail with reference to FIG. 11.

Under control of the processor 111 of the SoC 110, the storage device 140 may store data or may output the stored data. A data I/O speed of the storage device 140 may be lower than those of the cache memory 112, the near-memory device 120, and the far-memory device 130, and a storage capacity of the storage device 140 may be larger than those of the cache memory 112, the near-memory device 120, and the far-memory device 130. For example, the storage device 140 may be a non-volatile memory device such as a flash memory device.

As described above, according to an embodiment of the present disclosure, the architecture of the electronic device 100 including the near-memory device 120 and the far-memory device 130 may be provided. The near-memory device 120 may include a plurality of memory channels. The plurality of memory channels may support various operation modes. The SoC 110 of the electronic device 100 may control the plurality of memory channels independently of each other. The plurality of memory channels may operate in different operation modes.

Figure 2:
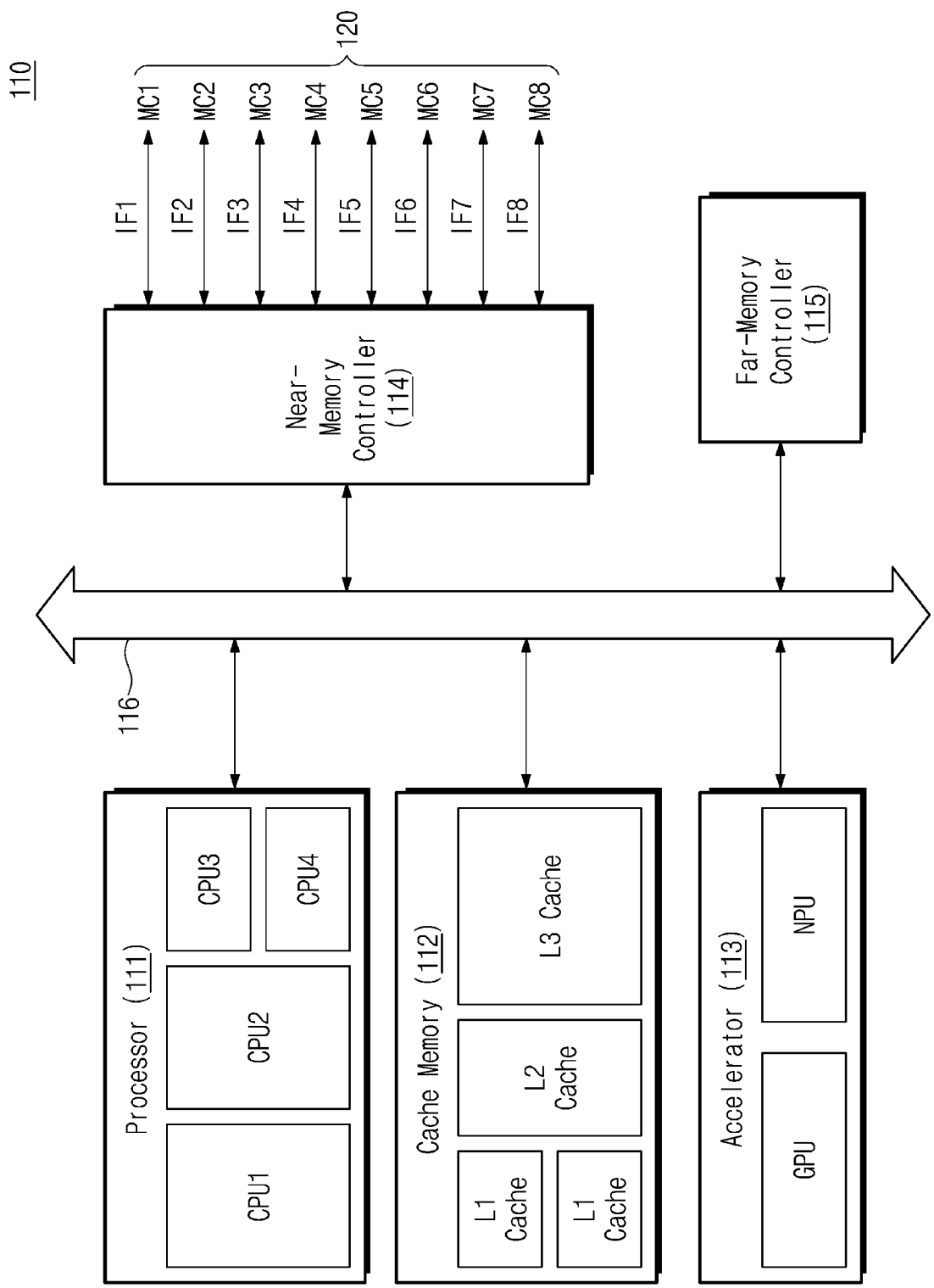
FIG. 2 is a block diagram illustrating a system-on-chip of FIG. 1, according to some embodiments of the present disclosure.

FIG. 2 is a block diagram illustrating a system-on-chip of FIG. 1 in detail, according to some embodiments of the present disclosure. Referring to FIGS. 1 and 2, the SoC 110 may communicate with the near-memory device 120. The SoC 110 may include the processor 111, the cache memory 112, the accelerator 113, the near-memory controller 114, the far-memory controller 115, and a bus 116. The bus 116 may provide connections of the processor 111, the cache memory 112, the accelerator 113, the near-memory controller 114, and the far-memory controller 115.

The processor 111 may include a first central processing unit (CPU), a second CPU, a third CPU, and a fourth CPU. The first to fourth CPUs may control an overall operation of the SoC 110 and may control a data I/O of the near-memory controller 114 and operation mode setting of a memory channel. For example, the first to fourth CPUs may decode and execute a program instruction.

In some embodiments, the processor 111 may include multiple cores of a big-little structure. For example, the first CPU and the second CPU may be processors optimized for complicated calculation and high-speed calculation. The third CPU and the fourth CPU may be processors optimized for low-power driving. Kinds and the number of CPUs included in the processor 111 of FIG. 2 are an example and may be variously changed by one skilled in the art.

The cache memory 112 may include a first level cache, a second level cache, and a third level cache. The first level cache may have a small storage capacity and may provide a fast data I/O speed. A storage capacity of the second level cache may be larger than that of the first level cache, a data I/O speed of the second level cache may be lower than that of the first level cache. A storage capacity of the third level cache may be larger than that of the second level cache, a data I/O speed of the third level cache may be lower than that of the second level cache.

Kinds and the number of caches included in the cache memory 112 of FIG. 2 are an example and may be variously changed by one skilled in the art. In some embodiments, unlike the embodiment illustrated in FIG. 2, the first level cache may be implemented to be included in the same core or cluster as the CPU.

The accelerator 113 may include, for example, a graphics processing unit (GPU) and a neural processing unit (NPU). The GPU may perform a graphics operation. The NPU may perform operations associated with machine learning, artificial intelligence, and neural network. A result of an operation assisted by the GPU and the NPU may be provided to the near-memory device 120, the far-memory device 130, or the storage device 140 as data.

The near-memory controller 114 may communicate with the near-memory device 120. The near-memory device 120 may include first to eighth memory channels MC1 to MC8. The near-memory controller 114 may communicate with the first to eighth memory channels MC1 to MC8 through first to eighth interfaces IF1 to IF8. The near-memory controller 114 may control the first to eighth memory channels MC1 to MC8, independently of each other. For example, operation modes of the first to eighth memory channels MC1 to MC8 may be different from each other.

The far-memory controller 115 may communicate with the far-memory device 130. The processor 111 may communicate with the storage device 140 through the bus 116 and an interface circuit (not illustrated).

Figure 3A:
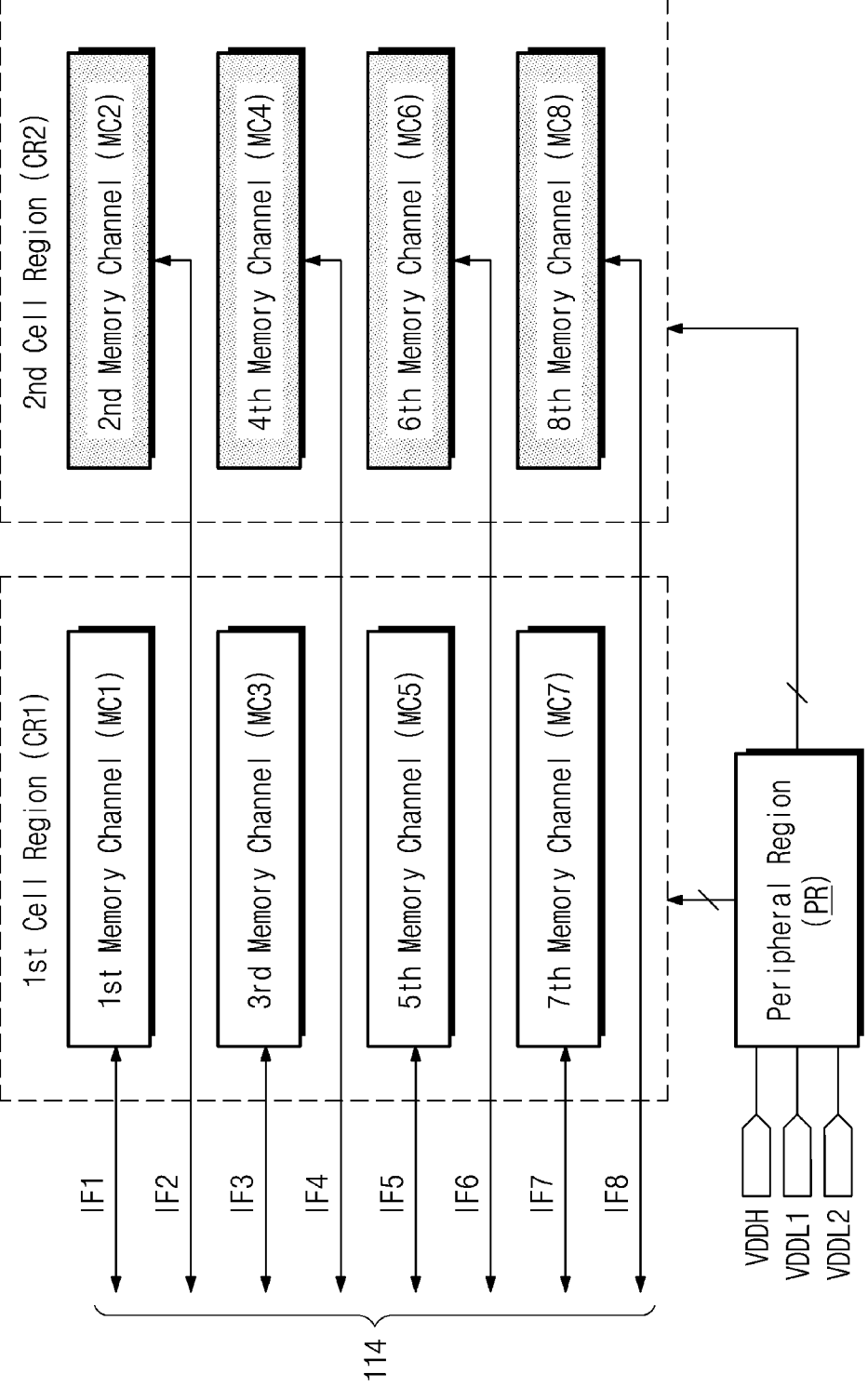
FIG. 3A is a block diagram illustrating a near-memory device of FIG. 1, according to some embodiments of the present disclosure.

FIG. 3A is a block diagram illustrating the near-memory device 120 of FIG. 1 in detail, according to some embodiments of the present disclosure. Referring to FIGS. 1 and 3A, the near-memory device 120 may communicate with the near-memory controller 114. The near-memory device 120 may include a first cell region CR1, a second cell region CR2, and a peripheral region PR.

The first cell region CR1 may include first, third, fifth, and seventh memory channels MC1, MC3, MC5, and MC7. The first, third, fifth, and seventh memory channels MC1, MC3, MC5, and MC7 may communicate with the near-memory controller 114 through first, third, fifth, and seventh interfaces IF1, IF3, IF5, and IF7, respectively.

The second cell region CR2 may include second, fourth, sixth, and eighth memory channels MC2, MC4, MC6, and MC8. The second, fourth, sixth, and eighth memory channels MC2, MC4, MC6, and MC8 may communicate with the near-memory controller 114 through second, fourth, sixth, and eighth interfaces IF2, IF4, IF6, and IF8, respectively.

In some embodiments, an operation mode of the first cell region CR1 may be different from an operation mode of the second cell region CR2. For example, the near-memory controller 114 may set operation modes of the memory channels MC1, MC3, MC5, and MC7 of the first cell region CR1 to the first mode through the interfaces IF1, IF3, IF5, and IF7. The near-memory controller 114 may set operation modes of the memory channels MC2, MC4, MC6, and MC8 of the second cell region CR2 to the second mode through the interfaces IF2, IF4, IF6, and IF8. The first mode may be a high-performance mode (e.g., a high-speed mode or a low-latency mode). The second mode may be a low-power mode.

The peripheral region PR may be connected with the first cell region CR1 and the second cell region CR2. The peripheral region PR may receive a high power supply voltage VDDH, a first low power supply voltage VDDL1, and a second low power supply voltage VDDL2. A voltage level of the high power supply voltage VDDH may be higher than a voltage level of the first low power supply voltage VDDL1. The voltage level of the first low power supply voltage VDDL1 may be higher than a voltage level of the second low power supply voltage VDDL2.

The peripheral region PR may provide the power supply voltages VDDH, VDDL1, and VDDL2 to the first and second cell regions CR1 and CR2. Each of the memory channels MC1 to MC8 may selectively use one of the power supply voltages VDDH, VDDL1, and VDDL2 based on an operation mode thereof.

For example, the memory channels MC1, MC3, MC5, and MC7 operating in the first mode may select the high power supply voltage VDDH of the power supply voltages VDDH, VDDL1, and VDDL2. The memory channels MC2, MC4, MC6, and MC8 operating in the second mode may select the first low power supply voltage VDDL1 of the power supply voltages VDDH, VDDL1, and VDDL2.

Figure 3B:
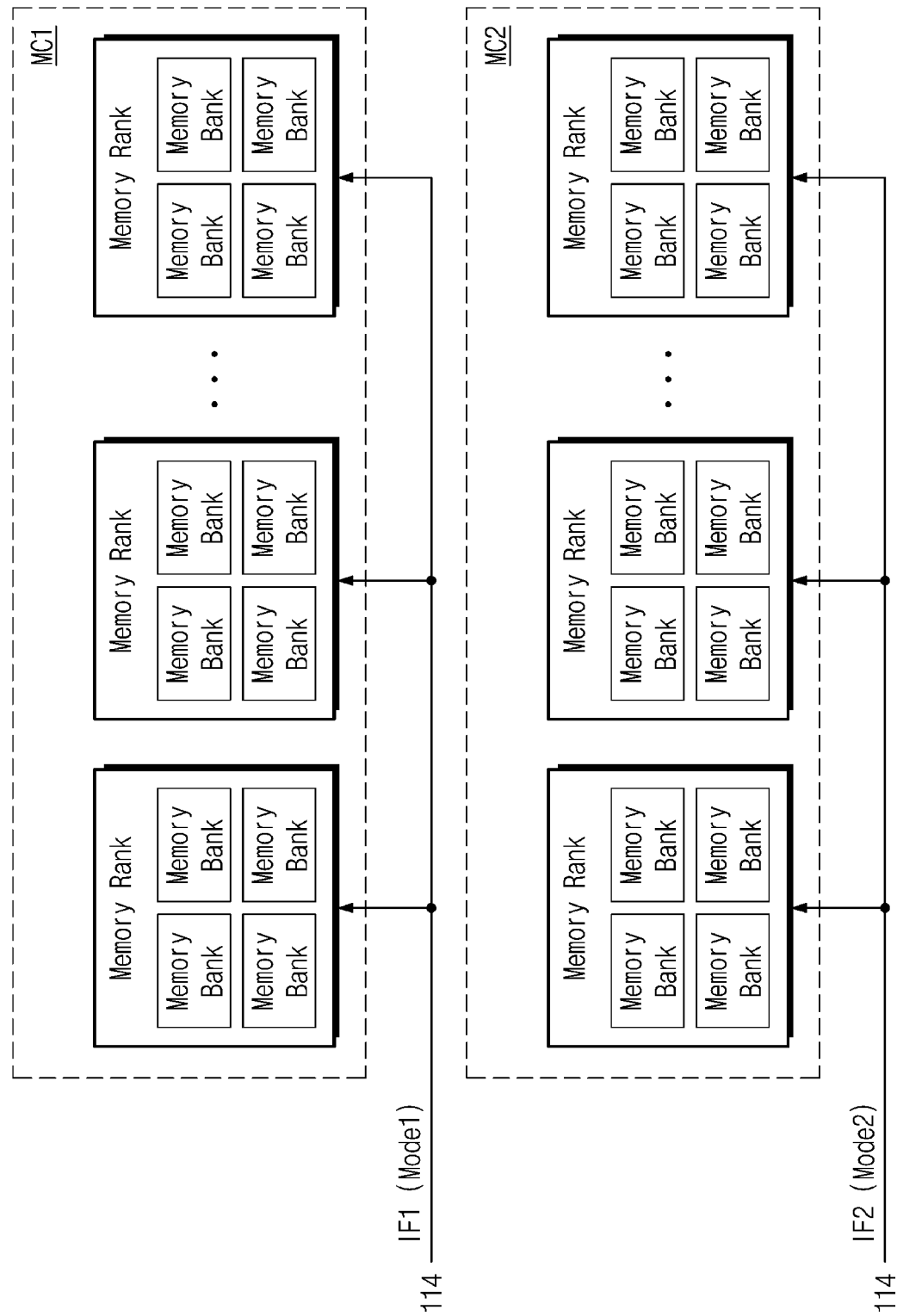
FIG. 3B is a block diagram illustrating memory channels of FIG. 3A, according to some embodiments of the present disclosure.

FIG. 3B is a block diagram illustrating memory channels of FIG. 3A in detail, according to some embodiments of the present disclosure. As a representative example, the first memory channel MC1 and the second memory channel MC2 of FIG. 3A will be described with reference to FIG. 3B.

The first memory channel MC1 may communicate with the near-memory controller 114 through the first interface IF1. The near-memory controller 114 may set an operation mode of the first memory channel MC1 to the first mode through the first interface IF1. The first memory channel MC1 may include a plurality of memory ranks. Each of the plurality of memory ranks may include a plurality of memory banks. All the memory ranks (or all the memory banks) included in the first memory channel MC1 may operate in the first mode.

The second memory channel MC2 may communicate with the near-memory controller 114 through the second interface IF2. The near-memory controller 114 may set an operation mode of the second memory channel MC2 to the second mode through the second interface IF2. The second memory channel MC2 may include a plurality of memory ranks. Each of the plurality of memory ranks may include a plurality of memory banks. All the memory ranks (or all the memory banks) included in the second memory channel MC2 may operate in the second mode.

Figure 4:
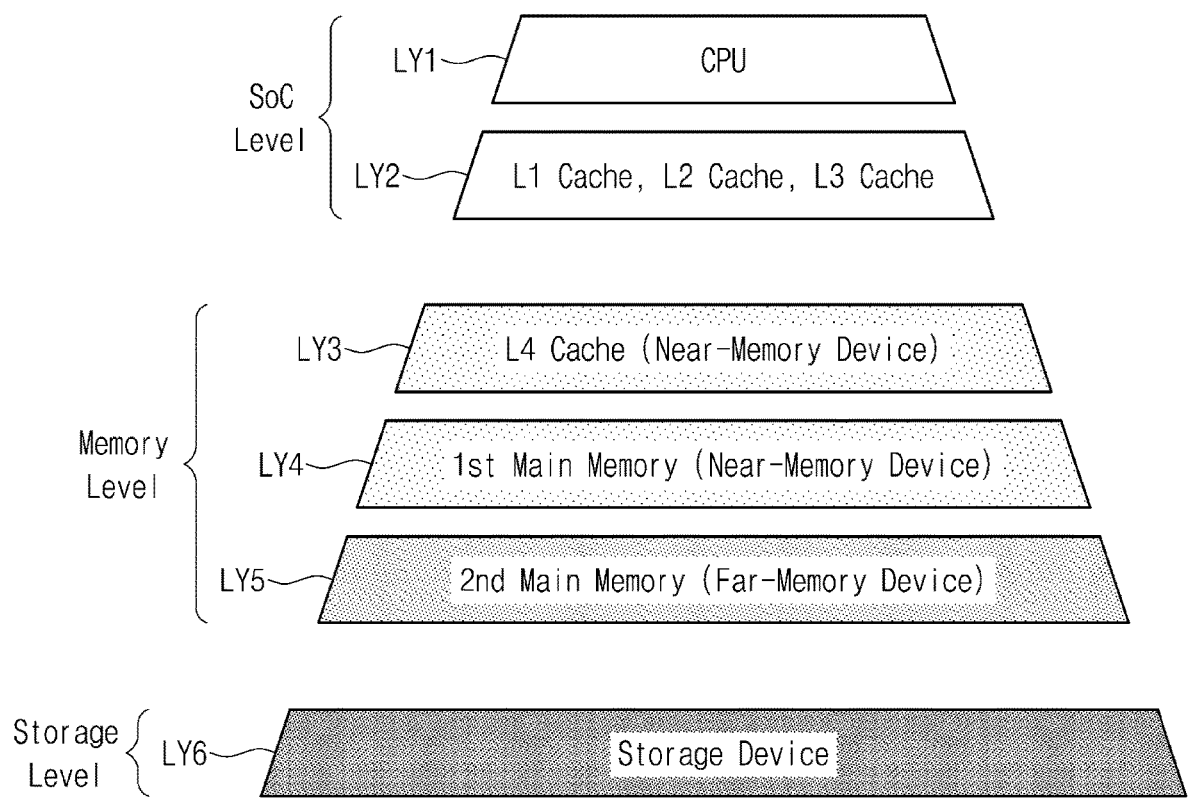
FIG. 4 is a diagram describing a memory hierarchical structure according to some embodiments of the present disclosure.

FIG. 4 is a diagram describing a memory hierarchical structure according to some embodiments of the present disclosure. A memory hierarchical structure is illustrated in FIG. 4. The memory hierarchical structure may correspond to the electronic device 100 of FIG. 1. The memory hierarchical structure may be in the form of a pyramid.

According to some embodiments of the present disclosure, the memory hierarchical structure may include a first layer LY1, a second layer LY2, a third layer LY3, a fourth layer LY4, a fifth layer LY5, and a sixth layer LY6. For example, as a layer becomes closer to the first layer LY1, a level of the layer is referred to as being high, and as a layer becomes closer to the sixth layer LY6, a level of the layer is referred to as being low. As a level of a layer becomes higher, the layer may have the tendency that a frequency of an access to a corresponding memory is high, a data I/O speed is fast, manufacturing costs increase, and a storage capacity decreases.

The first layer LY1 may be a layer of a CPU register. For example, the first layer LY1 may correspond to a register of the processor 111 of FIG. 1 or registers of the first to fourth CPUs of the processor 111 of FIG. 2.

The second layer LY2 may be a cache memory layer. For example, the second layer LY2 may correspond to the cache memory 112 of FIG. 1 or the first level cache, the second level cache, and the third level cache of the cache memory 112 of FIG. 2. The first and second layers LY1 and LY2 may be referred to as "layers of an SoC level".

The third layer LY3 may be a cache memory layer that is provided by a near-memory device. A layer level of the third layer LY3 that is used as a cache memory may be lower than a layer level of the second layer LY2 corresponding to a cache memory embedded in an SoC. For example, the third layer LY3 may correspond to the case where the first memory channel MC1 of the near-memory device 120 of FIG. 1 is used as a cache memory.

The fourth layer LY4 may be a main memory layer that is provided by the near-memory device. A layer level of the fourth layer LY4 that is a layer provided by the near-memory device may be lower than a layer level of the third layer LY3. For example, the fourth layer LY4 may correspond to the case where the first memory channel MC1 of the near-memory device 120 of FIG. 1 is used as a main memory.

In this case, a memory channel supporting the third layer LY3 and a memory channel supporting the fourth layer LY4 may be physically the same. Whether a corresponding memory channel operates in the third layer LY3 or the fourth layer LY4 may be determined depending on an operation mode of the corresponding memory channel.

The fifth layer LY5 may be a main memory layer that is provided by a far-memory device. Because the fifth layer LY5 is used as a main memory but is a layer provided by the far-memory device physically more distant from the SoC than the near-memory device, a data I/O speed and a layer level of the fifth layer LY5 may be lower than those of the fourth layer LY4. For example, the fifth layer LY5 may correspond to the far-memory channel FMC of the far-memory device 130 of FIG. 1. The third, fourth, and fifth LY3, LY4, and LY5 may be referred to as "layers of a memory level".

The sixth layer LY6 may be a high-capacity storage layer that is provided by a storage device. For example, the sixth layer LY6 may correspond to the storage device 140 of FIG. 1. The sixth layer LY6 may be referred to as a "layer of a storage level".

As described above, according to an embodiment of the present disclosure, the memory channel of the near-memory device may support both the cache memory layer and the main memory layer. That is, according to an embodiment of the present disclosure, the architecture of an electronic device may be provided in which a near-memory device may operate as a cache memory or a main memory based on an operation mode.

Figure 5:
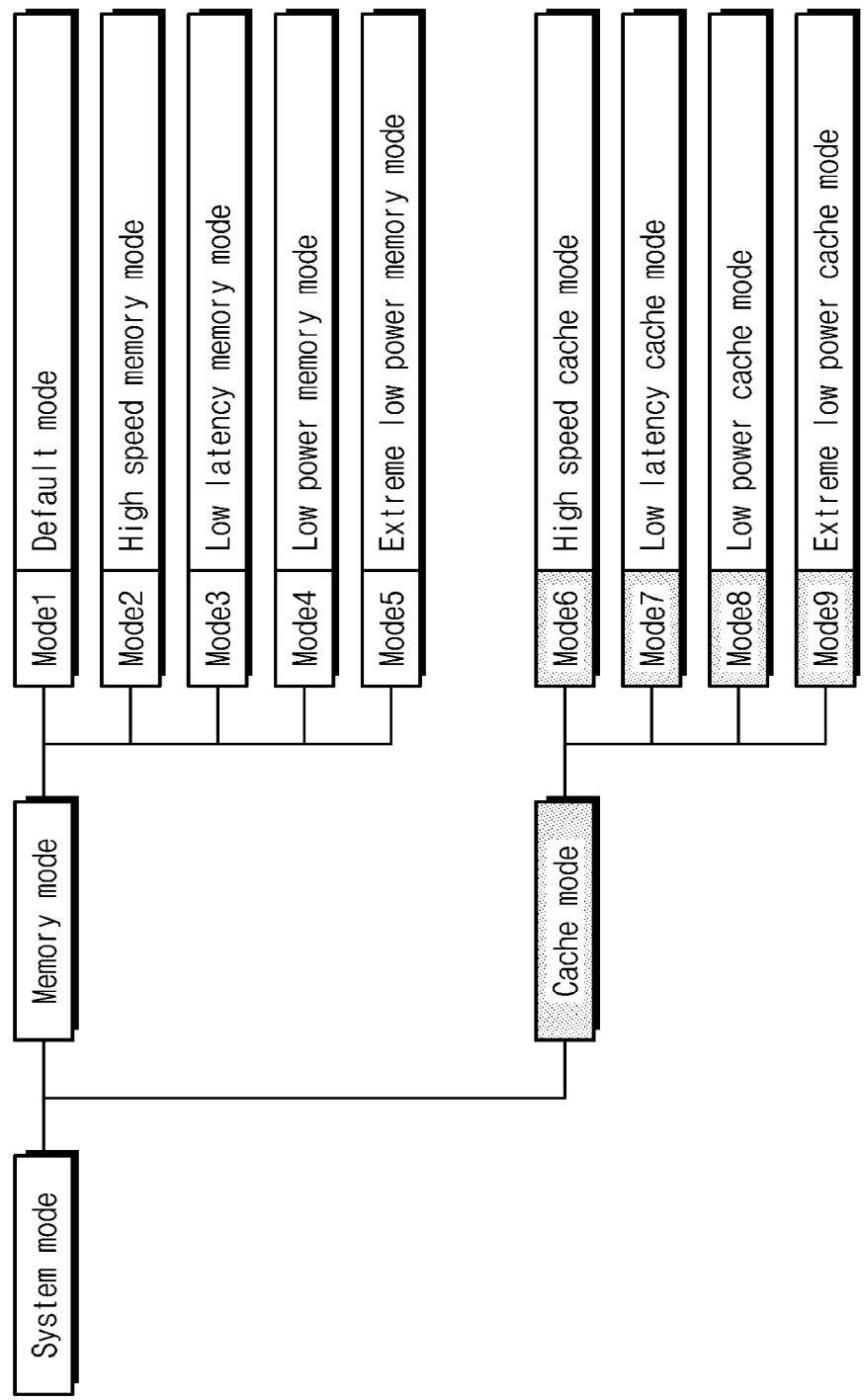
FIG. 5 is a diagram for describing operation modes of a memory channel according to some embodiments of the present disclosure.

FIG. 5 is a diagram for describing operation modes of a memory channel according to some embodiments of the present disclosure. Operation modes of a memory channel according to some embodiments of the present disclosure will be described with reference to FIG. 5. The operation modes may be supported by a memory channel of a near-memory device. For example, the memory channels MC1 and MC2 of the near-memory device 120 of FIG. 1 may further support operation modes of FIG. 5, independently of the first and second modes.

According to an embodiment of the present disclosure, an operation mode of the memory channel of the near-memory device may define a system mode, a power supply voltage, a frequency magnification of a data clock, and a time magnification of a latency parameter.

The system mode may be classified as a memory mode or a cache mode. For example, the memory mode may correspond to the case of being used as a memory of the fourth layer LY4 of FIG. 4. The cache mode may correspond to the case of being used as a memory of the third layer LY3 of FIG. 4.

The power supply voltage may indicate a power supply voltage corresponding to a set operation mode from among the power supply voltages VDDH, VDDL1, and VDDL2 provided by the peripheral region PR of FIG. 2. For example, in the first mode, a default power supply voltage may be the high power supply voltage VDDH.

The data clock may be a clock signal that is used to process a data signal in a memory channel, and a frequency of the data clock may be higher than that of a normal clock (e.g., a system clock). As a frequency magnification of the data clock increases, a data I/O speed of a memory device may increase. The data clock will be described in more detail with reference to FIG. 7.

The latency parameter may indicate at least one of parameters associated with a time period from a time at which a memory channel receives a command to a time at which the memory channel receives/outputs data. For example, the latency parameter may be associated with a time period from a time at which the memory channel receives a read command to a time at which the memory channel outputs read data or may be associated with a time period from a time at which the memory channel receives a write command to a time at which the memory channel receives write data. As the time magnification of the latency parameter becomes higher, a time period taken for data to be input and/or output from a time at which a command is received may increase. That is, as the time magnification of the latency parameter becomes higher, a delay may increase.

In some embodiments, the latency parameter may include a core parameter and a peripheral parameter. To adjust the latency parameter may mean to adjust at least one of the core parameter or the peripheral parameter.

For example, the core parameter may include time periods tRCD, tRP, and tWR according to the LPDDR standard. The time period tRCD may mean a RAS-to-CAS delay (e.g., a delay between a row address strobe command and a column strobe command) and may indicate a period from a time at which a memory bank is activated to a time at which a read command is processed. The time period tRP may mean a row address strobe (RAS) precharge time and may indicate a period from a time at which a memory bank is precharged to a time at which the memory bank is activated. The time period tWR may mean a write recovery time and may indicate a period from a time at which a time period determined in advance passes from the reception of a write command, to a time at which the memory bank is precharged.

For example, the peripheral parameter may include a time period tCL according to the LPDDR standard. The time period tCL may mean an average low pulse width and may indicate an average of widths of low pulses that are continuous, of which a number of cycles (e.g., 200) is determined in advance.

The memory mode may include a first mode, a second mode, a third mode, a fourth mode, and a fifth mode. The cache mode may include a sixth mode, a seventh mode, an eighth mode, and a ninth mode, and in this case, the terms "first to ninth modes" in the example embodiments of FIG. 5 may be used to distinguish different modes, and are not intended to be limited by the terms "first and second modes" described with reference to FIGS. 1, 3A, and 3B or to be limited thereto.

The first mode may be a default mode. In the first mode, a corresponding memory channel of the near-memory device may be used as a main memory. The memory channel may use a power supply voltage (hereinafter referred to as a "default power supply voltage") set to a default value, a data clock of a default frequency magnification, and a latency parameter of a default time magnification.

The second mode may be a high-speed memory mode. In the second mode, a corresponding memory channel of the near-memory device may be used as a main memory. The memory channel may use the default power supply voltage, the data clock of a frequency magnification higher than the default frequency magnification, and the latency parameter of the default time magnification.

The third mode may be a low latency memory mode. In the third mode, a corresponding memory channel of the near-memory device may be used as a main memory. The memory channel may use the default power supply voltage, the data clock of the default frequency magnification, and the latency parameter of a time magnification lower than the default time magnification.

The fourth mode may be a low power memory mode. In the fourth mode, a corresponding memory channel of the near-memory device may be used as a main memory. The memory channel may use a power supply voltage whose voltage level is lower than that of the default power supply voltage, the data clock of the default frequency magnification, and the latency parameter of a time magnification higher than the default time magnification.

The fifth mode may be an extreme low power memory mode. In the fifth mode, a corresponding memory channel of the near-memory device may be used as a main memory. The memory channel may use a power supply voltage whose voltage level is lower than that of the power supply voltage in the fourth mode, the data clock of the default frequency magnification, and the latency parameter of a time magnification higher than the time magnification in the fourth mode.

The sixth mode may be a high-speed cache mode. In the sixth mode, a corresponding memory channel of the near-memory device may be used as a cache memory. The memory channel may use the default power supply voltage, the data clock of a frequency magnification higher than the default frequency magnification, and the latency parameter of the default time magnification.

The seventh mode may be a low latency cache mode. In the seventh mode, a corresponding memory channel of the near-memory device may be used as a cache memory. The memory channel may use the default power supply voltage, the data clock of the default frequency magnification, and the latency parameter of a time magnification lower than the default time magnification.

The eighth mode may be a low power cache mode. In the eighth mode, a corresponding memory channel of the near-memory device may be used as a cache memory. The memory channel may use a power supply voltage whose voltage level is lower than that of the default power supply voltage, the data clock of the default frequency magnification, and the latency parameter of a time magnification higher than the default time magnification.

The ninth mode may be an extreme low power cache mode. In the ninth mode, a corresponding memory channel of the near-memory device may be used as a cache memory. The memory channel may use a power supply voltage whose voltage level is lower than that of the power supply voltage in the eighth mode, the data clock of the default frequency magnification, and the latency parameter of a time magnification higher than the time magnification in the eighth mode.

FIG. 6 is a table describing operation modes of a memory channel according to some embodiments of the present disclosure. The first to ninth modes of FIG. 6 may be embodied as respective examples of the first to ninth modes of FIG. 5. Referring to FIGS. 5 and 6, the memory channel of the near-memory device may operate in one of the first to ninth modes.

In the first mode, the system mode may be the memory mode. For driving, the memory channel may use the high power supply voltage VDDH, may use the data clock whose frequency magnification is "1×", and may use the latency parameter whose time magnification is "1×".

In the second mode, the system mode may be the memory mode. For driving, the memory channel may use the high power supply voltage VDDH, may use the data clock whose frequency magnification is "1.2×", and may use the latency parameter whose time magnification is "1×". In this case, that the frequency magnification is "1.2×" may mean that a frequency of the data clock is 1.2 times a frequency of the data clock in a default mode (e.g., the first mode).

In the third mode, the system mode may be the memory mode. For driving, the memory channel may use the high power supply voltage VDDH, may use the data clock whose frequency magnification is "1×", and may use the latency parameter whose time magnification is "0.8×". In this case, that the time magnification is "0.8×" may mean that a length of a time period corresponding to the latency parameter is 0.8 times a time period corresponding to the latency parameter in the default mode (e.g., the first mode).

In the fourth mode, the system mode may be the memory mode. For driving, the memory channel may use the first low power supply voltage VDDL1, may use the data clock whose frequency magnification is "1×", and may use the latency parameter whose time magnification is "1.1×" (that is, corresponding to 1.1 times a time period corresponding to the latency parameter in the default mode).

In the fifth mode, the system mode may be the memory mode. For driving, the memory channel may use the second low power supply voltage VDDL2, may use the data clock whose frequency magnification is "1×", and may use the latency parameter whose time magnification is "1.3×" (that is, corresponding to 1.3 times a time period corresponding to the latency parameter in the default mode).

In the sixth mode, the system mode may be the cache mode. For driving, the memory channel may use the high power supply voltage VDDH, may use the data clock whose frequency magnification is "1.2×", and may use the latency parameter whose time magnification is "1×".

In the seventh mode, the system mode may be the cache mode. For driving, the memory channel may use the high power supply voltage VDDH, may use the data clock whose frequency magnification is "1×", and may use the latency parameter whose time magnification is "0.8×".

In the eighth mode, the system mode may be the cache mode. For driving, the memory channel may use the first low power supply voltage VDDL1, may use the data clock whose frequency magnification is "1×", and may use the latency parameter whose time magnification is "1.1×".

In the ninth mode, the system mode may be the cache mode. For driving, the memory channel may use the second low power supply voltage VDDL2, may use the data clock whose frequency magnification is "1×", and may use the latency parameter whose time magnification is "1.3×".

Figure 7:
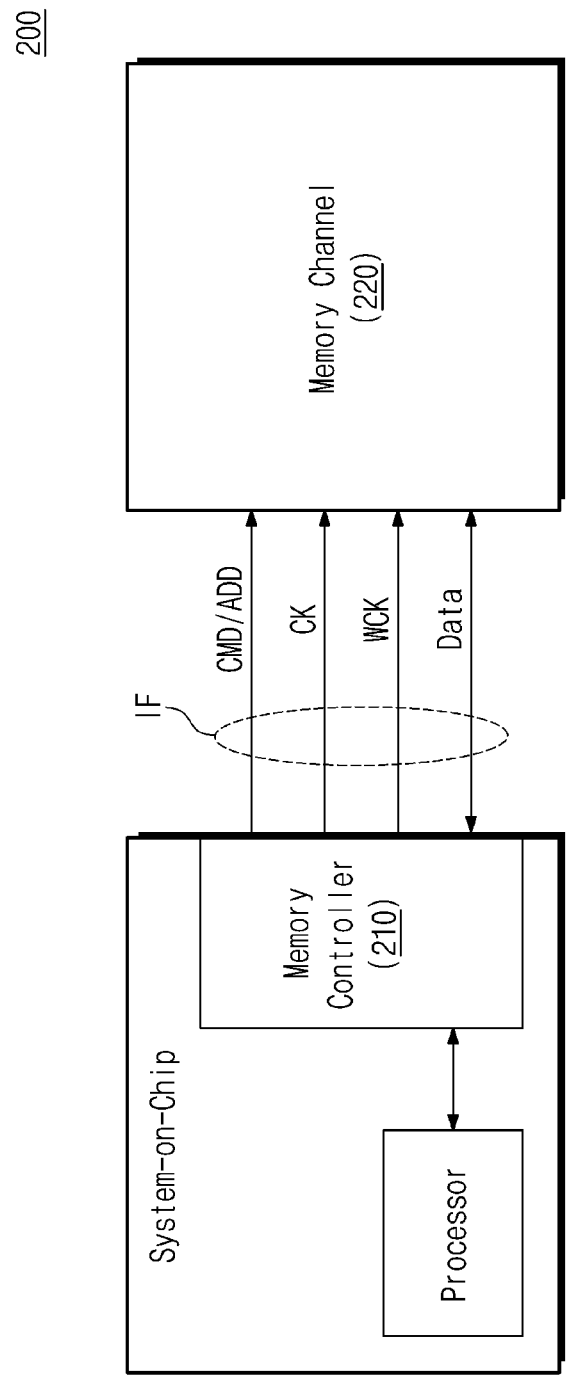
FIG. 7 is a block diagram of an electronic device according to some embodiments of the present disclosure.

FIG. 7 is a block diagram of an electronic device according to some embodiments of the present disclosure. Referring to FIG. 7, an electronic device 200 may include a system-on-chip and a memory channel 220. The system-on-chip may include a processor and a memory controller 210. The memory controller 210 may communicate with the memory channel 220.

The electronic device 200, the system-on-chip, the processor, the memory controller 210, and the memory channel 220 may respectively correspond to the electronic device 100, the system-on-chip 110, the near-memory controller 114, and one of the first and second memory channels MC1 and MC2 of the near-memory device 120 in the above-described embodiments.

The memory controller 210 may communicate with the memory channel 220 through an interface IF under control of the processor. The interface IF may provide the transmission of the following from the memory controller 210 to the memory channel 220: a command CMD, an address ADD, a clock CK, and a data clock WCK. Also, the interface IF may provide data communication between the memory controller 210 and the memory channel 220. In some embodiments, the interface IF may comply with the LPDDR standard.

The command CMD may be a signal indicating an operation to be performed by the memory channel 220. For example, the command CMD may indicate read, write, refresh, precharge, mode register write (MRW), row address strobe (RAS), column address strobe (CAS), deselect (DES), and the like.

The address ADD may be a signal indicating a location of a memory rank, a memory bank, or the like of the memory channel 220, at which an operation corresponding to the command CMD is to be performed. For example, the address ADD may include a row address and a column address of a memory cell of a memory bank belonging to a selected memory rank. In some embodiments, the command CMD and the address ADD may be transmitted through one bus (e.g., a CMD/ADD bus).

The clock CK may be a signal that toggles periodically. For example, the clock CK may be a system clock that the system-on-chip uses. In some embodiments, the clock CK may include complementary clock signals (e.g., CK_t and CK_c).

The data clock WCK may be a signal that is used to read or write data. For example, the data clock WCK may be a signal that is used to read, from the memory channel 220, read data corresponding to a read command or to store write data corresponding to a write command in the memory channel 220. A frequency of the data clock WCK may be higher than a frequency of the clock CK. In some embodiments, the data clock WCK may include complementary clock signals (e.g., WCK_t and WCK_c).

The data may be read data corresponding to a read command or write data corresponding to a write command. The data may read from the memory channel 220 based on toggling of the data clock WCK or may be stored in the memory channel 220 based on toggling of the data clock WCK. The data may include a data signal DQ and a data mask inversion signal DMI (see FIG. 8). The data signal DQ may be a signal indicating actual information of data. The data mask inversion signal DMI may be a signal for data mask and data bus inversion.

Figure 8:
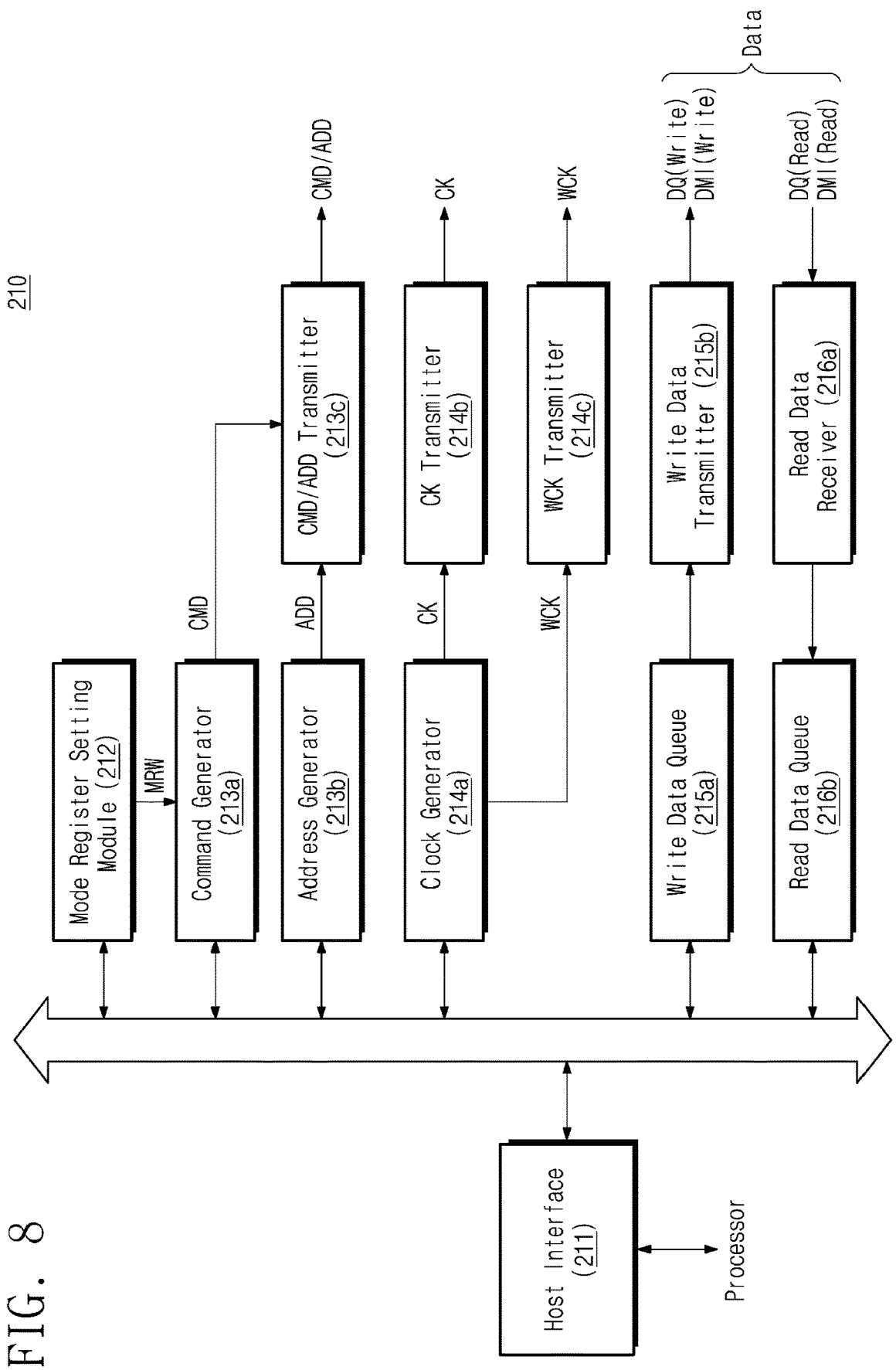
FIG. 8 is a block diagram illustrating a memory controller of FIG. 7, according to some embodiments of the present disclosure.

According to some embodiments of the present disclosure, the memory controller 210 may set an operation mode of the memory channel 220 based on an MRW command (see FIG. 8). For example, the memory controller 210 may generate the MRW command including an OP code corresponding to the operation mode. For example, the memory controller 210 may generate the MRW command before power-up of the memory channel 220. The memory controller 210 may output the MRW command to the memory channel 220 through the CMD/ADD bus. A mode register of the memory channel 220 may set the operation mode based on the MRW command. Based on setting of the operation mode, a system mode (e.g., a memory mode or a cache mode) of the memory channel 220, a power supply voltage used by the memory channel 220, a frequency magnification of the data clock WCK, and a data I/O timing may be changed.

FIG. 8 is a block diagram illustrating a memory controller of FIG. 7 in detail, according to some embodiments of the present disclosure. Referring to FIGS. 7 and 8, the memory controller 210 may communicate with the processor. The memory controller 210 may output the command CMD, the address ADD, the clock CK, and the data clock WCK to the memory channel 220. The memory controller 210 may perform data communication with the memory channel 220.

The memory controller 210 may include a host interface 211, a mode register setting module 212, a command generator 213a, an address generator 213b, a CMD/ADD transmitter 213c, a clock generator 214a, a CK transmitter 214b, a WCK transmitter 214c, a write data queue 215a, a write data transmitter 215b, a read data receiver 216a, and a read data queue 216b.

The host interface 211 may communicate with the processor. The processor may determine an operation mode of the memory channel 220. The host interface 211 may receive information of an operation mode from the processor and may provide the information of the operation mode to the mode register setting module 212. The host interface 211 may receive data for a write operation and may output the write data to the write data queue 215a. The host interface 211 may receive read data from the read data queue 216b and may output the read data to the processor.

The mode register setting module 212 may receive the information of the operation mode from the processor through the host interface 211. The mode register setting module 212 may provide the command generator 213a with an MRW command including the information of the operation mode. Alternatively, the mode register setting module 212 may assist the command generator 213a in generating the MRW command, based on the information of the operation mode.

The command generator 213a may generate the command CMD. The command generator 213a may output the command CMD to the CMD/ADD transmitter 213c. In some embodiments, the command generator 213a may output, to the CMD/ADD transmitter 213c, the MRW command including the information of the operation mode.

The address generator 213b may generate the address ADD. The address generator 213b may output the address ADD to the CMD/ADD transmitter 213c.

The CMD/ADD transmitter 213c may receive the command CMD from the command generator 213a. The CMD/ADD transmitter 213c may receive the address ADD from the address generator 213b. The CMD/ADD transmitter 213c may output the command CMD and the address ADD to the memory channel 220.

The clock generator 214a may generate the clock CK and the data clock WCK. The clock generator 214a may output the clock CK to the CK transmitter 214b. The clock generator 214a may output the data clock WCK to the WCK transmitter 214c. The CK transmitter 214b may output the clock CK to the memory channel 220. The WCK transmitter 214c may output the data clock WCK to the memory channel 220.

The write data queue 215a may store write data to be written in the memory channel 220. For example, the write data stored in the write data queue 215a may be data provided from the processor. The write data queue 215a may output the write data to the write data transmitter 215b. The write data transmitter 215b may output the write data to the memory channel 220. For example, the write data transmitter 215b may output, to the memory channel 220, the data signal DQ and the data mask inversion signal DMI for a write operation.

The read data receiver 216a may receive read data from the memory channel 220. For example, the read data receiver 216a may receive, from the memory channel 220, the data signal DQ and the data mask inversion signal DMI for a read operation. The read data receiver 216a may output the read data to the read data queue 216b. The read data queue 216b may store the read data received from the memory channel 220. The read data queue 216b may provide the processor with the stored read data depending on a request of the processor.

Figure 9:
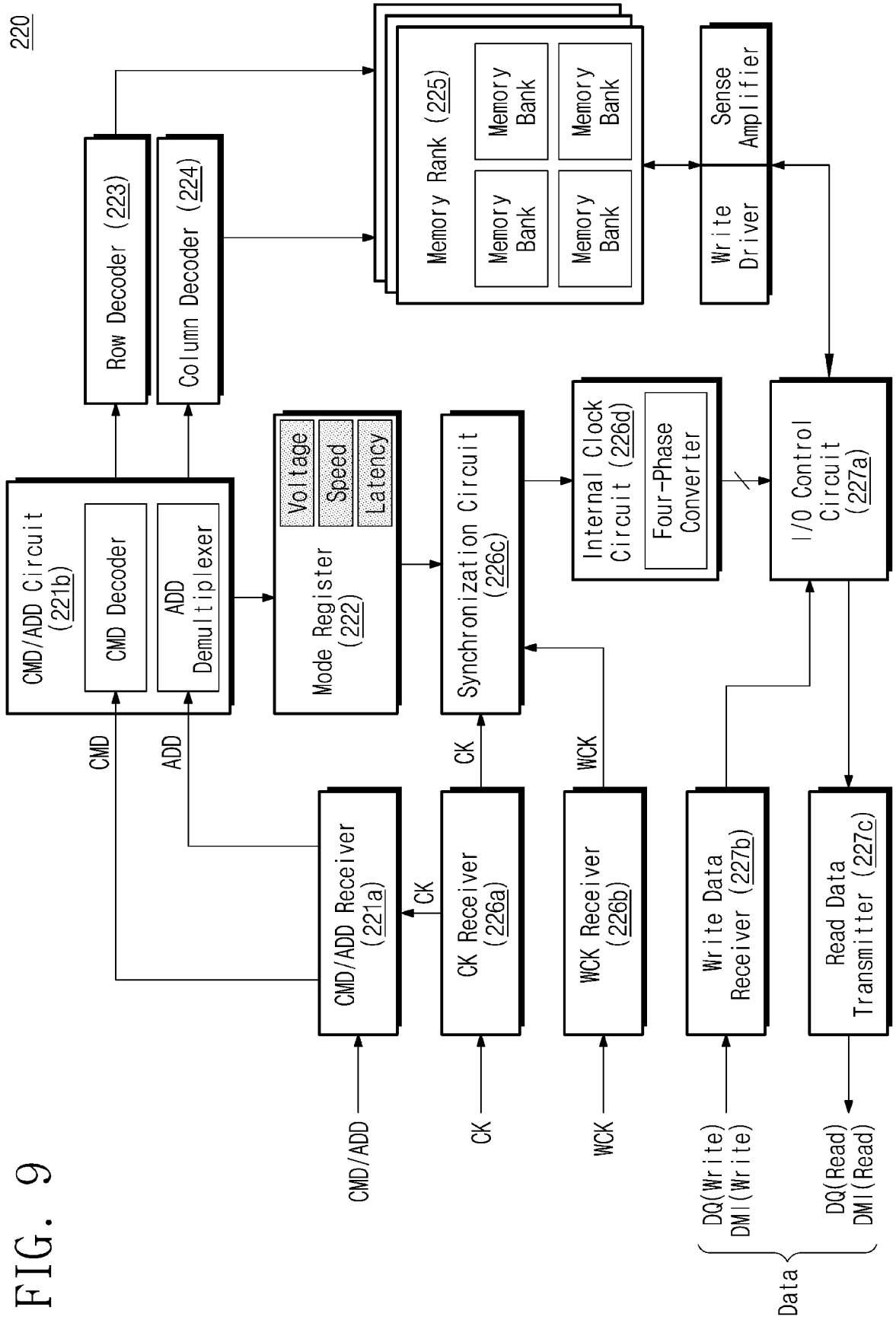
FIG. 9 is a block diagram illustrating a memory channel of FIG. 7, according to some embodiments of the present disclosure.

FIG. 9 is a block diagram illustrating a memory channel of FIG. 7 in detail, according to some embodiments of the present disclosure. Referring to FIGS. 7 and 9, the memory channel 220 may communicate with the memory controller 210. The memory channel 220 may receive the command CMD, the address ADD, the clock CK, and the data clock WCK from the memory controller 210. The memory channel 220 may perform data communication with the memory controller 210.

The memory channel 220 may include a CMD/ADD receiver 221a, a CMD/ADD circuit 221b, a mode register 222, a row decoder 223, a column decoder 224, a plurality of memory ranks 225, a CK receiver 226a, a WCK receiver 226b, a synchronization circuit 226c, an internal clock circuit 226d, an input/output (I/O) control circuit 227a, a write data receiver 227b, and a read data transmitter 227c.

The CMD/ADD receiver 221a may receive the command CMD and the address ADD from the memory controller 210. The CMD/ADD receiver 221a may receive the clock CK from the CK receiver 226a. The CMD/ADD receiver 221a may output the command CMD and the address ADD to the CMD/ADD circuit 221b based on the clock CK.

The CMD/ADD circuit 221b may include a CMD decoder and an ADD demultiplexer. The CMD decoder may decode the command CMD. The ADD demultiplexer may demultiplex the address ADD. The CMD/ADD circuit 221b may control the mode register 222 based on a decoding result of the CMD decoder.

The mode register 222 may be connected with the CMD/ADD circuit 221b. In some embodiments, settings of the mode register 222 may be changed based on a command decoded by the CMD/ADD circuit 221b. For example, when the command CMD is determined by the CMD decoder of the CMD/ADD circuit 221b as the MRW command, the CMD/ADD circuit 221b may set the operation mode of the memory channel 220 by changing the settings of the mode register 222. In more detail, a system mode of the memory channel 220, a kind of a power supply voltage that the memory channel 220 uses, a frequency magnification of a data clock, a time magnification of a latency parameter, and the like may be changed by the settings of the mode register 222.

In some embodiments, the mode register 222 may set the operation mode of the memory channel 220 based on the MRW command, during a power-up operation of a memory device including the memory channel 220. Alternatively, the mode register 222 may set the operation mode of the memory channel 220 based on the MRW command, while a memory device including the memory channel 220 does not perform a read operation or a write operation (e.g., after power-up, during a refresh operation, or in an idle state).

The CMD/ADD circuit 221b may control the row decoder 223 and the column decoder 224 based on a demultiplexing result of the ADD demultiplexer. For example, the ADD demultiplexer may demultiplex the address ADD and may obtain a row address and a column address. The CMD/ADD circuit 221b may output the row address to the row decoder 223. The CMD/ADD circuit 221b may output the column address to the column decoder 224.

The row decoder 223 may be connected with the plurality of memory ranks 225. The row decoder 223 may decode the row address received from the CMD/ADD circuit 221b. The column decoder 224 may be connected with the plurality of memory ranks 225. The column decoder 224 may decode the column address received from the CMD/ADD circuit 221b.

Each of the plurality of memory ranks 225 may be connected with the row decoder 223, the column decoder 224, a corresponding write driver, and a corresponding sense amplifier. Each of the plurality of memory ranks 225 may include a plurality of memory banks. Each of the plurality of memory banks may include a plurality of memory cells arranged in a row direction and a column direction. Each of the plurality of memory cells may have a corresponding row address and a corresponding column address and may store data in the form of a logical high level or a logical low level.

The CK receiver 226a may receive the clock CK from the memory controller 210. The CK receiver 226a may output the clock CK to the CMD/ADD receiver 221a and the synchronization circuit 226c. The clock CK may provide a reference timing in the overall operation of the memory channel 220.

The WCK receiver 226b may receive the data clock WCK from the memory controller 210. The WCK receiver 226b may output the data clock WCK to the synchronization circuit 226c.

The synchronization circuit 226c may make synchronization of the data clock WCK based on the clock CK, under control of the mode register 222. The synchronization circuit 226c may output a synchronized data clock to the internal clock circuit 226d.

The internal clock circuit 226d may receive the synchronized data clock from the synchronization circuit 226c. The internal clock circuit 226d may generate an internal clock based on the synchronized data clock. The internal clock circuit 226d may output the internal clock to the I/O control circuit 227a. The internal clock may be used for the read operation and the write operation in the I/O control circuit 227a.

In some embodiments, the internal clock circuit 226d may include a four-phase converter. For example, the four-phase converter may generate first to fourth internal clocks in which phase differences with the synchronized data clock are 0 degree, 90 degrees, 180 degrees, and 270 degrees, respectively. The first to fourth internal clocks may be used for the read operation and the write operation in the I/O control circuit 227a.

The I/O control circuit 227a may be connected with the write data receiver 227b, the read data transmitter 227c, the internal clock circuit 226d, and the plurality of memory ranks 225. The I/O control circuit 227a may control the read operation and the write operation with the plurality of memory ranks 225. The write data receiver 227b may receive write data from the memory controller 210 and transmit the write data to the I/O control circuit 227a. The read data transmitter 227c may receive read data from the I/O control circuit 227a and output the read data to the memory controller 210.

In some embodiments, the I/O control circuit 227a may assist the write operation of the memory rank 225. For example, the I/O control circuit 227a may receive the write data from the write data receiver 227b. The I/O control circuit 227a may output the write data to the memory rank 225 through a write driver.

In some embodiments, the I/O control circuit 227a may assist the read operation of the memory rank 225. For example, the I/O control circuit 227a may receive the read data from the memory rank 225 through a sense amplifier. The I/O control circuit 227a may output the read data to the read data transmitter 227c.

Figure 10:
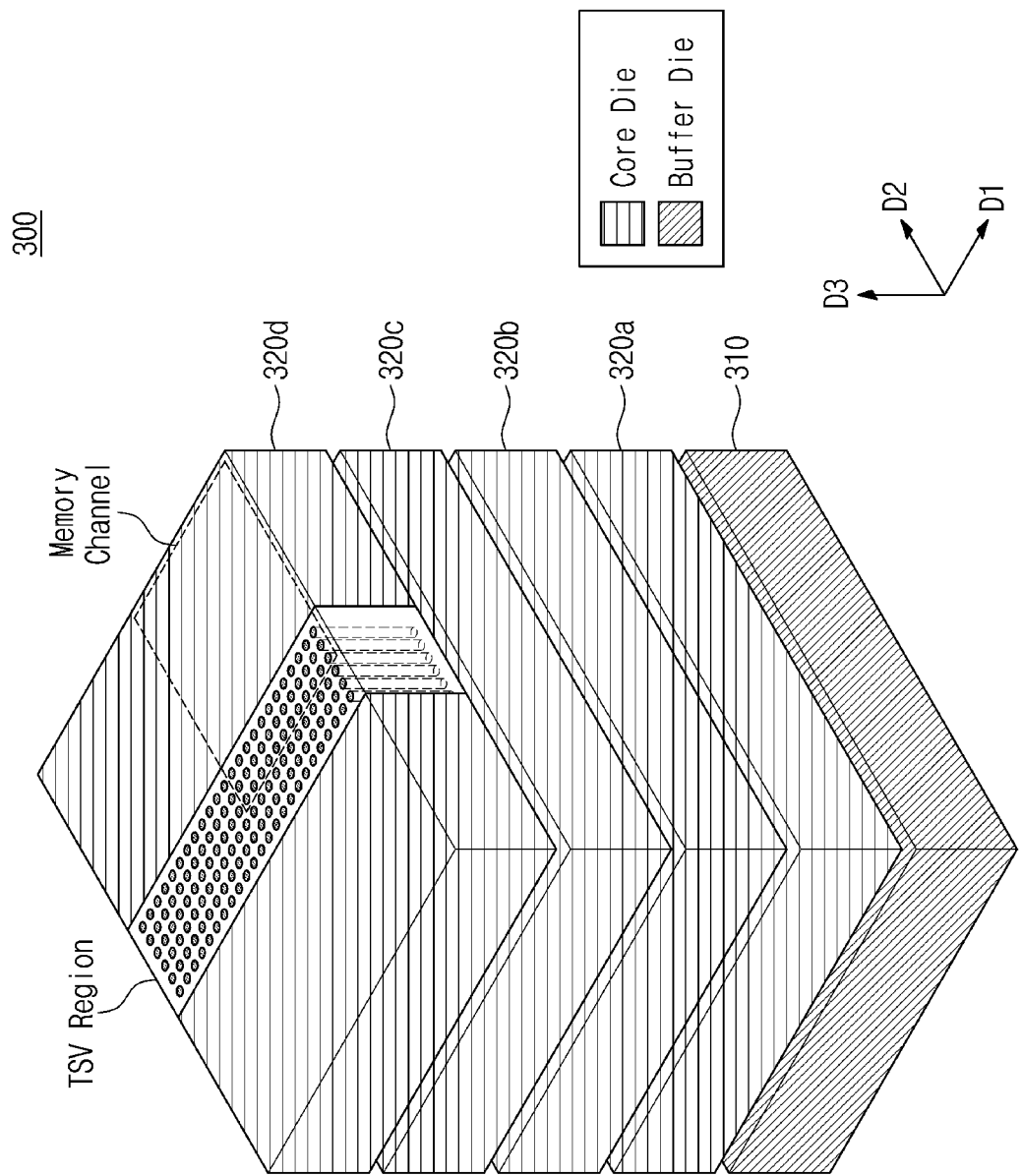
FIG. 10 is a diagram describing an electronic device having a three-dimensional stacked structure according to some embodiments of the present disclosure.

FIG. 10 is a diagram describing an electronic device having a three-dimensional stacked structure according to some embodiments of the present disclosure. An electronic device 300 having a three-dimensional stacked structure is illustrated in FIG. 10. The electronic device 300 may include a buffer die 310, a first core die 320a, a second core die 320b, a third core die 320c, and a fourth core die 320d. For better understanding, the electronic device 300 is illustrated as including the first to fourth core dies 320a, 320b, 320c, and 320d, but the present disclosure is not limited thereto. For example, the number of core dies included in the electronic device 300 may increase or decrease.

The buffer die 310 may correspond to the near-memory controller 114 of FIGS. 1 and 2 or the memory controller 210 of FIGS. 7 and 8. The first to fourth core dies 320a, 320b, 320c, and 320d may correspond to the near-memory device 120 of FIGS. 1, 3A, and 3B, or the memory device including the memory channel 220 of FIGS. 7 and 9.

Below, for convenience of description, a first direction D1, a second direction D2, and a third direction D3 will be defined. The first direction D1 may be a direction that is parallel to a semiconductor substrate. The second direction D2 may be a direction that is perpendicular to the first direction D1. The third direction D3 may be a direction that is perpendicular to a plane defined by the first and second directions D1 and D2. For example, the first direction D1, the second direction D2, and the third direction D3 may be referred to as a "row direction", a "column direction", and a "height direction", respectively.

According to some embodiments of the present disclosure, the electronic device 300 may include a memory controller and a memory channel. The memory controller and the memory channel may have a three-dimensional stacked structure. In detail, in some embodiments, the three-dimensional stacked structure may include the buffer die 310, the first core die 320a, the second core die 320b, the third core die 320c, and the fourth core die 320d stacked in the third direction D3.

The buffer die 310 and the first to fourth core dies 320a, 320b, 320c, and 320d may respectively include through silicon via (TSV) regions overlapping each other in the third direction D3. To avoid a complicated drawing, FIG. 10 shows only the TSV region of the fourth core die 320d, but each of the buffer die 310 and the first to third core dies 320a, 320b, and 320c may include the TSV region overlapping the TSV region of the fourth core die 320d in the third direction D3.

The TSV region may include a plurality of TSVs. The number of TSVs included in the TSV region of FIG. 10 is an example, and the number of TSVs included in the TSV region may increase or decrease. Each of the plurality of TSVs may penetrate a corresponding core in the third direction D3 and may transfer an electrical signal. The TSVs of different dies adjacent in the third direction D3 may be connected through micro-bumps. The micro-bumps connecting the TSVs will be described in more detail with reference to FIG. 11.

The buffer die 310 may include the memory controller communicating with a processor. Under control of the processor, the memory controller may generate signals for a data I/O (e.g., the command CMD, the address ADD, the clock CK, the data clock WCK, and the data signal of FIG. 7). The buffer die 310 may receive a power supply voltage from an external power device (or source) (e.g., the high power supply voltage VDDH, the first low power supply voltage VDDL1, or the second low power supply voltage VDDL2 of FIG. 3A). The buffer die 310 may provide the first to fourth core dies 320a, 320b, 320c, and 320d with the signals for the data I/O and the power supply voltage as electrical signals through the TSV region.

Each of the first to fourth core dies 320a, 320b, 320c, and 320d may include the TSV region and a plurality of memory channels. To avoid a complicated drawing, FIG. 10 shows only one memory channel on the fourth core die 320d, but the fourth core die 320d may further include other memory channels adjacent to the illustrated memory channel in the first direction D1 and/or the second direction D2. As in the above description, each of the first to third core dies 320a, 320b, and 320c may include a plurality of memory channels.

In each of the first to fourth core dies 320a, 320b, 320c, and 320d, the plurality of TSVs of the TSV region may be allocated to one of the plurality of memory channels. Each of the plurality of memory channels may include a plurality of memory banks. The plurality of memory banks may receive or output electrical signals through allocated TSVs of the TSV region, that is, may store data based on the electrical signals or may output the stored data based on the electrical signals.

In some embodiments, the electronic device 300 may include a first memory channel and a second memory channel implemented to be symmetrical with respect to each other. For example, the first core die 320a may include a first memory channel and a second memory channel that have physically the same characteristic. The first memory channel may support both the first mode and the second mode as an operation mode. The second memory channel may support both the first mode and the second mode as an operation mode.

In some embodiments, the electronic device 300 may include a first memory channel and a second memory channel implemented to be asymmetrical with respect to each other. For example, the first core die 320a may include a first memory channel and a second memory channel that have physically different characteristics. The first memory channel may support both the first mode and the second mode as an operation mode. The second memory channel may support the second mode as an operation mode but may not support the first mode. Memory channels having physically different characteristics will be described in more detail with reference to FIGS. 10 and 11.

Figure 11:
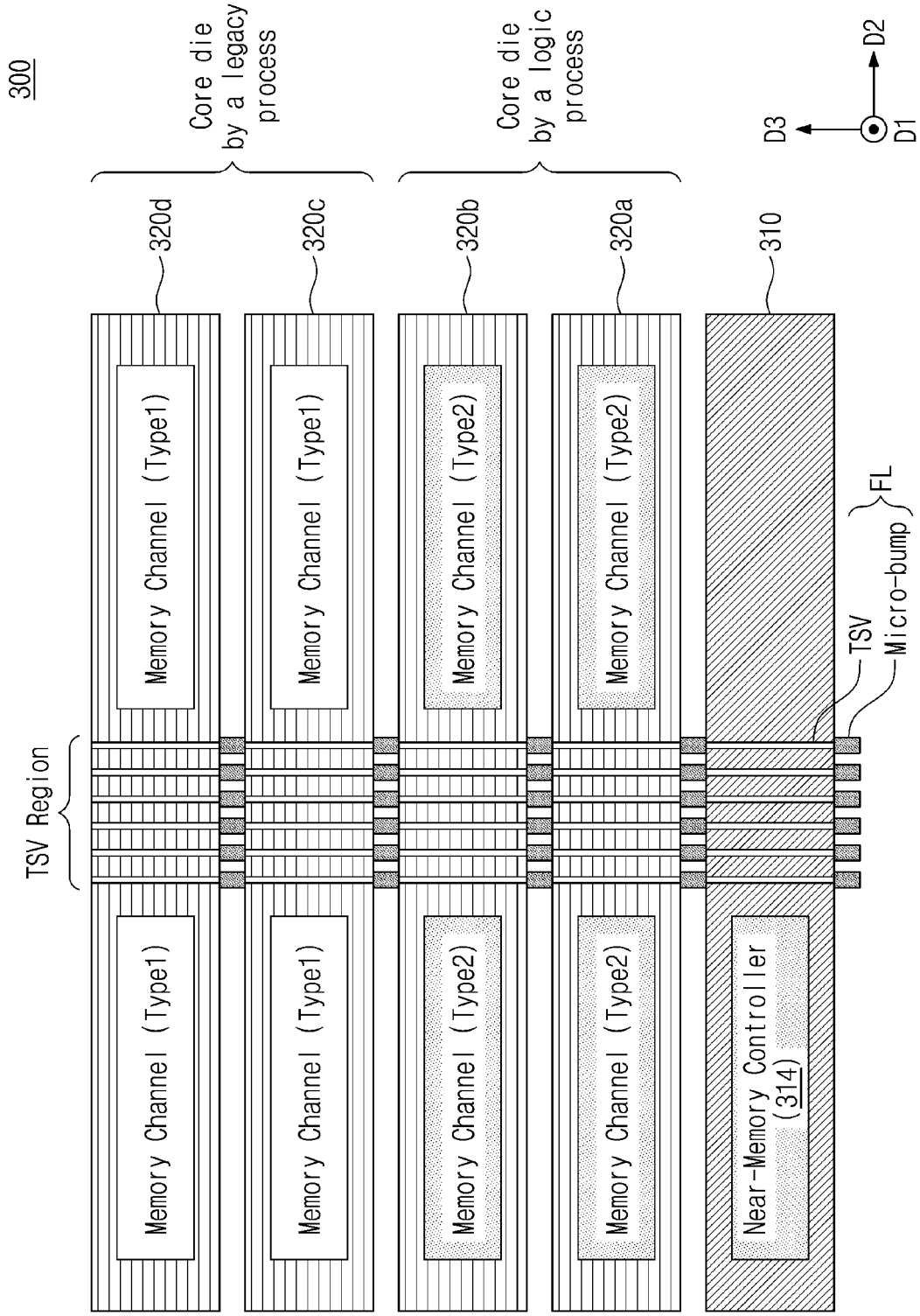
FIG. 11 is a diagram illustrating an electronic device of FIG. 10, according to some embodiments of the present disclosure.

FIG. 11 is a diagram illustrating an electronic device of FIG. 10 in detail, according to some embodiments of the present disclosure. FIG. 11 shows an example of a cross-sectional view of the electronic device 300 of FIG. 10, which is taken along a plane defined by the second and third directions D2 and D3, and viewed in the first direction D1.

Referring to FIGS. 10 and 11, the electronic device 300 may include the buffer die 310 and the first to fourth core dies 320a, 320b, 320c, and 320d. Each of the buffer die 310 and the first to fourth core dies 320a, 320b, 320c, and 320d may include the TSV region. The TSV region may include a plurality of TSVs. TSVs that are included in different dies and are adjacent to each other in the third direction D3 may be connected by a micro-bump. For example, the TSV of the buffer die 310 and the TSV of the first core die 320a may be connected through the corresponding micro-bump.

The buffer die 310 may include a near-memory controller 314. The near-memory controller 314 may transmit signals for a data I/O to the first to fourth core dies 320a, 320b, 320c, and 320d. The buffer die 310 may receive a power supply voltage from an external power device (or source) (not illustrated) through a feeding line FL. The feeding line FL may connect different cores or may connect the external power device and the buffer die 310. The feeding line FL may include corresponding TSVs and corresponding micro-bumps. The feeding line FL may transfer electrical signals such as signals for a data I/O and a power supply voltage.

According to some embodiments of the present disclosure, the electronic device 300 may include a first-type memory channel and a second-type memory channel that have different physical characteristics. The first-type memory channel may be a memory channel whose performance is low. The second-type memory channel may be a memory channel whose performance is high. For example, the first-type memory channel may support only the low-power mode. The second-type memory channel may support bot the low-power mode and the high-performance mode (e.g., a high-speed mode or a low-latency mode) depending on the MRW command of the near-memory controller 314.

In some embodiments, the first and second core dies 320a and 320b may be manufactured by a logic process. The logic process may be, in general, a process technique that is used to manufacture the buffer die 310. Each of the first and second core dies 320a and 320b may include the second-type memory channel. The second-type memory channel may support both the low-power mode and the high-performance mode.

In some embodiments, the third and fourth core dies 320c and 320d may be manufactured by a legacy process. The legacy process may be, in general, a process technique that is used to manufacture a core die. The legacy process may be simpler than the logic process. Each of the third and fourth core dies 320c and 320d may include the first-type memory channel. The first-type memory channel may support the low-power mode but may not support the high-performance mode.

Figure 12:
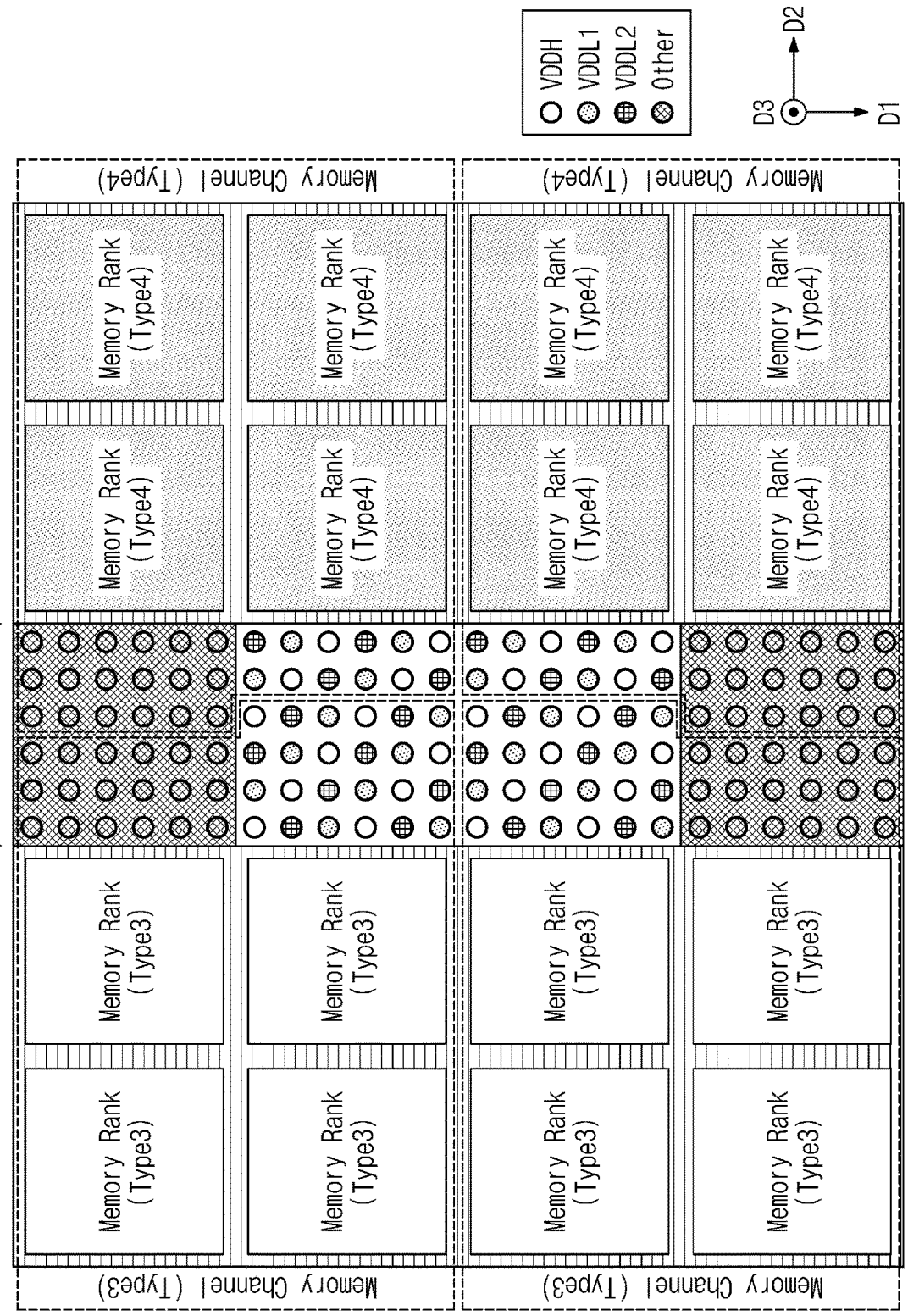
FIG. 12 is a diagram illustrating a core die of FIG. 10, according to some embodiments of the present disclosure.

FIG. 12 is a diagram illustrating a core die of FIG. 10 in detail, according to some embodiments of the present disclosure. FIG. 12 shows an example of a cross-sectional view of the first core die 320a of FIG. 10, which is taken along a plane defined by the first and second directions D1 and D2, and viewed in the third direction D3.

Referring to FIGS. 10 and 12, the first core die 320a may include the TSV region, a third-type memory channel, and a fourth-type memory channel. The TSV region may include a plurality of TSVs. An electrical signal transmitted through the plurality of TSVs may be one of the high power supply voltage VDDH, the first low power supply voltage VDDL1, the second low power supply voltage VDDL2, and other signals. The other signals may include signals for a data I/O. In FIG. 12, the number of TSVs and a ratio of the power supply voltages VDDH, VDDL1, and VDDL2 and the other signals among electric signals transmitted through the plurality of TSVs are only an example, and may be variously changed by one skilled in the art.

According to some embodiments of the present disclosure, the first core die 320a may include the third-type memory channel and the fourth-type memory channel that have different physical characteristics. The third-type memory channel may be a memory channel whose performance is high. The fourth-type memory channel may be a memory channel whose performance is low. For example, the third-type memory channel may support both the low-power mode and the high-performance mode. The fourth-type memory channel may support only the low-power mode.

In some embodiments, the first core die 320a may include the third-type memory channel. The third-type memory channel may be adjacent to the center of the TSV region in a direction facing away from the second direction D2 (or may be disposed on a first side of the TSV region). The third-type memory channel may include a third-type memory rank. The number of TSVs allocated to the third-type memory channel to supply a power supply voltage may be greater than the number of TSVs allocated to the fourth-type memory channel to supply a power supply voltage. The third-type memory channel may support both the low-power mode and the high-performance mode.

In some embodiments, the first core die 320a may further include the fourth-type memory channel. The fourth-type memory channel may be adjacent to the center of the TSV region in the second direction D2 (or may be disposed on a second side of the TSV region, which is opposite to the first side). The fourth-type memory channel may include a fourth-type memory rank. The number of TSVs allocated to the fourth-type memory channel to supply a power supply voltage may be less than the number of TSVs allocated to the third-type memory channel to supply a power supply voltage. The fourth-type memory channel may support the low-power mode but may not support the high-performance mode.

Figure 13:
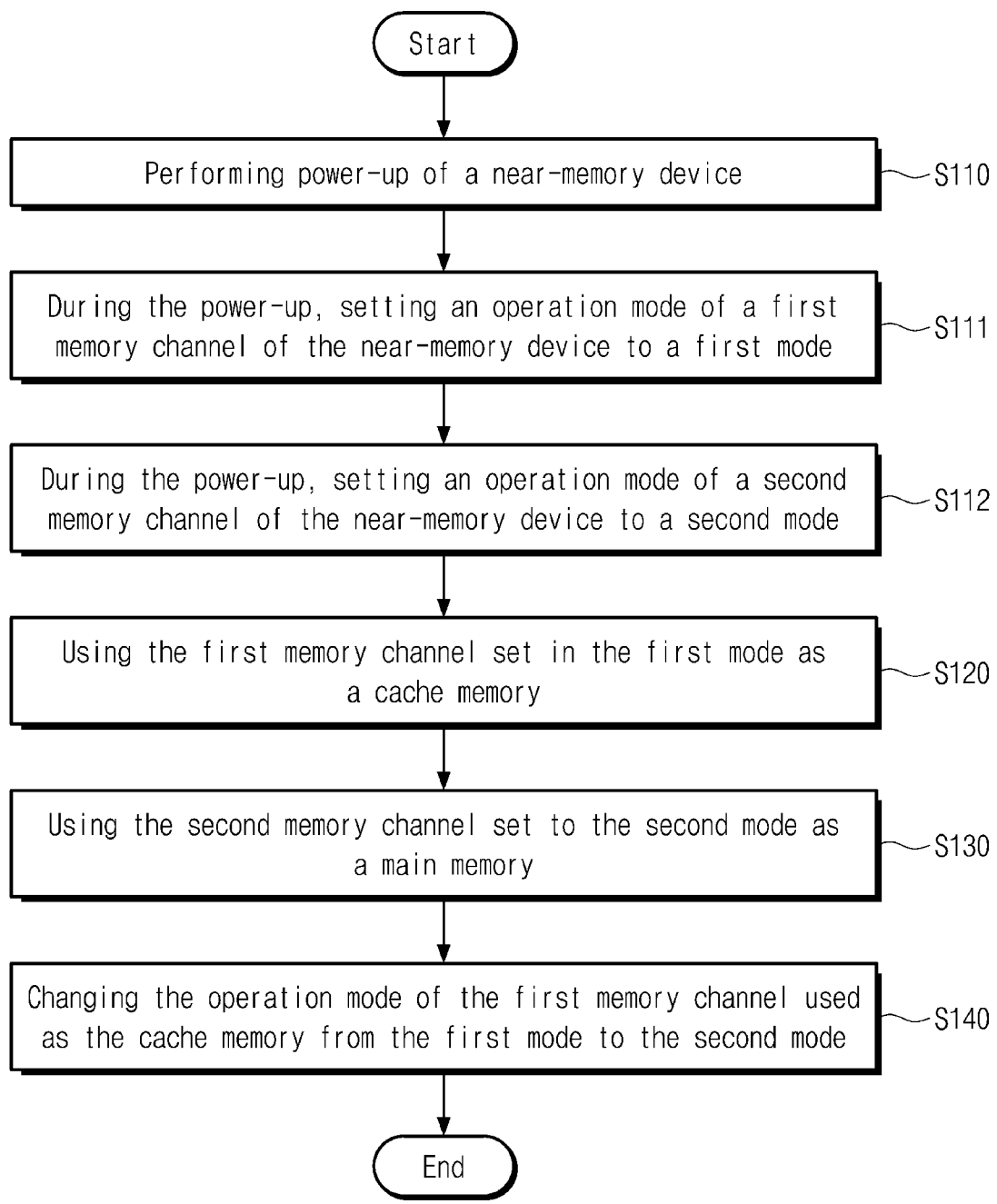
FIG. 13 is a flowchart describing an operating method of an electronic device according to some embodiments of the present disclosure.

FIG. 13 is a flowchart describing an operating method of an electronic device according to some embodiments of the present disclosure. The operating method of the electronic device according to some embodiments will be described with reference to FIG. 13. The electronic device may correspond to the electronic device 100 of FIG. 1, the electronic device 200 of FIG. 2, or the electronic device 300 of FIG. 10. The electronic device may include a near-memory device, a far-memory device, and a system-on-chip communicating with the near-memory device and the far-memory device. The near-memory device may include a first memory channel and a second memory channel.

In operation S110, the electronic device may perform power-up of the near-memory device. The power-up may indicate an operation of providing a power supply voltage to the near-memory device and initializing the near-memory device. In some embodiments, the power-up of the near-memory device may include an operation of setting a mode register of the near-memory device.

In operation S111, the electronic device may set an operation mode of the first memory channel of the near-memory device to the first mode, during the power-up in operation S110. The first mode may be the cache mode. For example, the first mode may correspond to one of the sixth to ninth modes of FIGS. 5 and 6.

In some embodiments, the electronic device may set the operation mode of the first memory channel based on the MRW command. For example, operation S111 may include providing, by the SoC, a first MRW command indicating the first mode to the first memory channel, and setting, by a first mode register, the operation mode of the first memory channel to the first mode.

In operation S112, the electronic device may set an operation mode of the second memory channel of the near-memory device to the second mode, during the power-up in operation S110. The second mode may be different from the first mode in operation S111. The second mode may be the memory mode. For example, the second mode may correspond to one of the first to fifth modes of FIGS. 5 and 6.

In some embodiments, the first mode and the second mode may be different in power consumption, data I/O speed, and/or latency. For example, the first mode may use a first power supply voltage, a first data clock of a first frequency magnification, and/or a first data clock of a first time magnification. The second mode may use a second power supply voltage, a second data clock of a second frequency magnification, and/or a second data clock of a second time magnification. In this case, the first power supply voltage may be different from the second power supply voltage, the first frequency magnification may be different from the second frequency magnification, and/or the first time magnification may be different from the second time magnification.

In some embodiments, the electronic device may set the operation mode of the second memory channel based on the MRW command. For example, operation S112 may include providing, by the SoC, a second MRW command indicating the second mode to the second memory channel, and setting, by a second mode register, the operation mode of the second memory channel to the second mode.

In operation S120, the electronic device may use the first memory channel set to the first mode as a cache memory. In operation S130, the electronic device may use the second memory channel set to the second mode as a main memory. A layer level of the cache memory may be higher than a layer level of the main memory. That is, the near-memory device of the electronic device may include a plurality of memory channels that operate in different layers independently of each other.

In operation S140, the electronic device may change the operation mode of the first memory channel used as the cache memory in operation S120 from the first mode to the second mode. After operation S140, the first memory channel whose operation mode is changed to the second mode may be used as a main memory.

In some embodiments, the electronic device may change the operation mode of the first memory channel based on the MRW command. For example, operation S140 may include providing, by the SoC, a third MRW command indicating the second mode to the first memory channel, and changing, by the first mode register, the operation mode of the first memory channel from the first mode to the second mode.

In this case, a time at which the changing of the operation mode of the first memory channel, that is, operation S140 is performed is not limited to the above time period, that is, the power-up period of the near-memory device. For example, unlike operation S111 and operation S112, operation S140 may be performed while a read or write operation of the near-memory device is not performed (e.g., after power-up, during a self-refresh operation, or in an idle state), instead of during the power-up.

Figure 14:
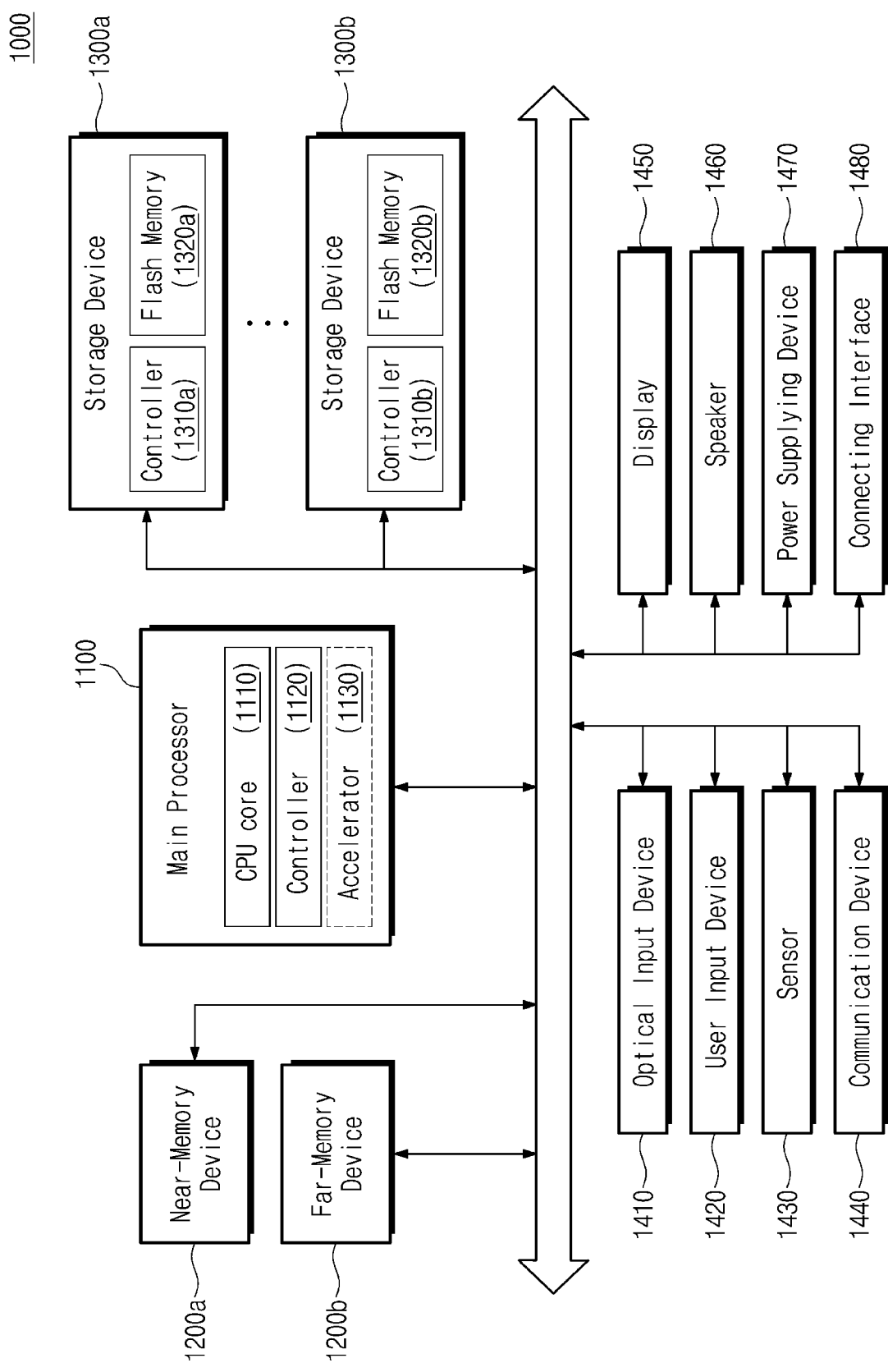
FIG. 14 is a block diagram of an electronic system according to some embodiments of the present disclosure.

FIG. 14 is a block diagram of an electronic system according to some embodiments of the present disclosure. An electronic system 1000 of FIG. 14 may be a mobile system such as a mobile phone, a smartphone, a tablet personal computer (PC), a wearable device, a health care device, or an Internet of things (IoT) device. However, the electronic system 1000 is not limited to the mobile system. For example, the electronic system 1000 may be implemented with a personal computer, a laptop, a server, a media player, or an automotive device such as a navigation system.

Referring to FIG. 14, the electronic system 1000 may include a main processor 1100, a near-memory device 1200a, a far-memory device 1200b, and storage devices 1300a and 1300b, and may further include one or more of an optical input device 1410, a user input device 1420, a sensor 1430, a communication device 1440, a display 1450, a speaker 1460, a power supplying device 1470, and a connecting interface 1480.

The electronic system 1000 may correspond to the electronic device 100 of FIG. 1, the electronic device 200 of FIG. 7, the electronic device 300 of FIG. 10, or an electronic device performing the operating method of FIG. 13. The near-memory device 1200a may correspond to the near-memory device 120 of FIGS. 1, 3A, and 3B, and may include the memory channel 220 of FIGS. 7 and 9. The near-memory device 1200a may include a plurality of memory channels operating in different operation modes.

The main processor 1100 may control an overall operation of the electronic system 1000, in more detail, may control operations of components of the electronic system 1000. The main processor 1100 may be implemented with a general-purpose processor, a special-purpose processor, and/or an application processor.

The main processor 1100 may include one or more CPU cores 1110, and may further include a controller 1120 for controlling the near-memory device 1200a, the far-memory device 1200b, and/or the storage devices 1300a and 1300b. In some embodiments, the main processor 1100 may further include an accelerator 1130 being a dedicated circuit for high-speed data calculation/computation such as artificial intelligence (AI) data calculation/computation. The accelerator 1130 may include a graphics processing unit (GPU), a neural processing unit (NPU), and/or a data processing unit (DPU) and may be implemented with a separate chip physically independent of any other component of the main processor 1100.

The near-memory device 1200a and the far-memory device 1200b may be used as a main memory of the electronic system 1000. The near-memory device 1200a and the far-memory device 1200b may include a volatile memory such as a static random access memory (SRAM) and/or a DRAM or may include a non-volatile memory such as a flash memory, a phase-change RAM (PRAM), and/or a resistive RAM (RRAM). The near-memory device 1200a may be implemented in the same package as the main processor 1100, and the far-memory device 1200b may be implemented in a package different from that of the main processor 1100.

The storage devices 1300a and 1300b may function as a non-volatile storage device storing data regardless of whether a power is supplied thereto, and may be higher in capacity than the near-memory device 1200a and the far-memory device 1200b. The storage device 1300a may include a storage controller 1310a and a flash memory 1320a storing data under control of the storage controller 1310a, and the storage device 1300b may include a storage controller 1310b and a flash memory 1320b storing data under control of the storage controller 1310b. Each of the flash memories 1320a and 1320b may include a flash memory of a two-dimensional (2D) structure or a V-NAND flash memory of a three-dimensional structure or may include different kinds of nonvolatile memories such as a PRAM and/or a RRAM.

The storage devices 1300a and 1300b may be included in the electronic system 1000 in a state of being physically separated from the main processor 1100 or may be implemented within the same package as the main processor 1100. Alternatively, the storage devices 1300a and 1300b may be implemented in the form of a solid state drive (SSD) or a memory card so as to be removably connected with any other components of the electronic system 1000 through an interface such as the connecting interface 1480 to be described later. The storage devices 1300a and 1300b may include a device to which the standard such as universal flash storage (UFS), embedded multi-media card (eMMC), or non-volatile memory express (NVMe) is applied, but the present disclosure is not limited thereto.

The optical input device 1410 may photograph (or capture) a still image or a moving image and may include a camera, a camcorder, and/or a webcam.

The user input device 1420 may receive various types of data that are input by a user of the electronic system 1000 and may include a touch pad, a keypad, a keyboard, a mouse, and/or a microphone.

The sensor 1430 may detect various types of physical quantities capable of being obtained from the outside of the electronic system 1000 and may convert the detected physical quantities to electrical signals. The sensor 1430 may include a temperature sensor, a pressure sensor, an illumination sensor, a position sensor, an acceleration sensor, a biosensor, and/or a gyroscope sensor.

The communication device 1440 may transmit and receive signals to and from external devices of the electronic system 1000 in compliance with various communication protocols. The communication device 1440 may be implemented to include an antenna, a transceiver, and/or a MODEM.

The display 1450 and the speaker 1460 may function as an output device that outputs visual information and auditory information to the user of the electronic system 1000.

The power supplying device 1470 may appropriately convert a power supplied from a battery (not illustrated) embedded in the electronic system 1000 and/or an external power device (or source) so as to be supplied to each component of the electronic system 1000.

The connecting interface 1480 may provide the connection between the electronic system 1000 and an external device, which is connected with the electronic system 1000 and exchanges data with the electronic system 1000. The connecting interface 1480 may be implemented with various interfaces such as, for example but not limited to, an ATA (Advanced Technology Attachment) interface, an SATA (Serial ATA) interface, an e-SATA (external SATA) interface, an SCSI (Small Computer System Interface) interface, an SAS (Serial Attached SCSI) interface, a PCI (Peripheral Component Interconnection) interface, a PCIe (PCI express) interface, an NVMe (NVM express) interface, an IEEE 1394 interface, an USB (Universal Serial Bus) interface, an SD (Secure Digital) card interface, an MMC (Multi-Media Card) interface, an eMMC (embedded Multi-Media Card) interface, an UFS (Universal Flash Storage) interface, an eUFS (embedded Universal Flash Storage) interface, and a CF (Compact Flash) card interface.

According to an embodiment of the present disclosure, an electronic device including a near-memory supporting mode setting, and an operating method thereof are provided.

Also, according to an embodiment of the present disclosure, an electronic device, which independently controls memory channels of a memory device such that overall efficiency of a system is improved, an operating speed is increased, a latency is decreased, power consumption is reduced, and various layers of memories are supported, and an operating method thereof are provided.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

While the present disclosure has been described with reference to example embodiments thereof, it will be apparent to those of ordinary skill in the art that various changes and modifications may be made thereto without departing from the spirit and scope of the present disclosure as set forth in the following claims and their equivalents.

What is claimed is:
1. An electronic device comprising:
a system-on-chip (SoC) including a processor, a near-memory controller controlled by the processor, and a far-memory controller controlled by the processor;
a near-memory device including a first memory channel configured to communicate with the near-memory controller and operate in a first mode of a plurality of modes, and a second memory channel configured to communicate with the near-memory controller and operate in a second mode different from the first mode from among the plurality of modes; and
a far-memory device configured to communicate with the far-memory controller,
wherein the first memory channel is further configured to, based on a command from the near-memory controller, change an operation mode from the first mode to the second mode.

2. The electronic device of claim 1, wherein the near-memory controller is further configured to generate a mode register write (MRW) command indicating the first mode or the second mode, and
wherein the first memory channel comprises a mode register configured to set the operation mode of the first memory channel to the first mode or the second mode based on the MRW command.

3. The electronic device of claim 2, wherein the near-memory controller is further configured to generate the MRW command before power-up of the first memory channel, and
wherein the mode register of the first memory channel is further configured to set the operation mode of the first memory channel to the first mode or the second mode based on the MRW command while the power-up is performed.

4. The electronic device of claim 1, wherein the operation mode of the first memory channel, based on the command from the near-memory controller, supports the first mode, the second mode, and a third mode of the plurality of modes,
wherein the first mode uses a first power supply voltage,
wherein the second mode uses a second power supply voltage lower than the first power supply voltage, and
wherein the third mode uses a third power supply voltage lower than the second power supply voltage.

5. The electronic device of claim 1, wherein the first mode uses a first data clock of a first frequency magnification, and
wherein the second mode uses a second data clock of a second frequency magnification higher than the first frequency magnification.

6. The electronic device of claim 1,
wherein the operation mode of the first memory channel supports the first mode, the second mode, a third mode, and a fourth mode of the plurality of modes,
wherein the first memory channel is further configured to, based on the command from the near-memory controller, operate in one of the first to the fourth modes, and
wherein the first mode uses a first latency parameter of a default time magnification,
wherein the second mode uses a second latency parameter of a first time magnification lower than the default time magnification,
wherein the third mode uses a third latency parameter of a second time magnification higher than the default time magnification, and
wherein the fourth mode uses a fourth latency parameter of a third time magnification higher than the second time magnification.

7. The electronic device of claim 1, wherein the SoC further includes a cache memory configured to communicate with the processor,
wherein the processor supports a first layer of a memory hierarchy,
wherein the cache memory supports a second layer lower than the first layer of the memory hierarchy,
wherein the first mode supports a third layer lower than the second layer of the memory hierarchy, and
wherein the second mode supports a fourth layer lower than the third layer of the memory hierarchy.

8. The electronic device of claim 7, wherein the first layer is a layer of a central processing unit (CPU) register,
wherein the second layer is a layer of a first level cache, a second level cache, and a third level cache,
wherein the third layer is a layer of a fourth level cache, and
wherein the fourth layer is a layer of a main memory.

9. The electronic device of claim 1, wherein the first memory channel and the second memory channel are implemented to be symmetrical with respect to each other,
wherein the first memory channel supports both the first mode and the second mode, and
wherein the second memory channel supports both the first mode and the second mode.

10. The electronic device of claim 1, wherein the first memory channel and the second memory channel are implemented to be asymmetrical with respect to each other,
wherein the first memory channel supports both the first mode and the second mode, and
wherein the second memory channel supports the second mode and does not support the first mode.

11. The electronic device of claim 10, wherein the near-memory controller and the near-memory device have a three-dimensional stacked structure,
wherein the three-dimensional stacked structure includes:
a buffer die including the near-memory controller;
a first core die stacked on the buffer die and including the first memory channel; and
a second core die stacked on the first core die and including the second memory channel,
wherein the buffer die and the first core die are based on a logic process, and
wherein the second core die is based on a legacy process.

12. The electronic device of claim 10, wherein the near-memory controller and the near-memory device have a three-dimensional stacked structure,
wherein the three-dimensional stacked structure includes:
a buffer die including the near-memory controller;
a core die stacked on the buffer die and including the first memory channel and the second memory channel; and
a plurality of through silicon vias (TSVs), each configured to transmit a power supply voltage from the buffer die to the core die, and
wherein a number of at least one first TSV allocated to the first memory channel from among the plurality of TSVs is greater than a number of at least one second TSV allocated to the second memory channel from among the plurality of TSVs.

13. The electronic device of claim 1, wherein the near-memory device and the SoC are included in a first package, and
wherein the far-memory device is included in a second package different from the first package.

14. The electronic device of claim 1, further comprising:
a storage device configured to communicate with the processor and configured to process a large amount of data,
wherein the SoC further includes:
a cache memory configured to communicate with the processor; and
an accelerator configured to assist the processor, and
wherein the far-memory device includes a far-memory channel controlled by the far-memory controller.

15. An electronic device comprising:
a system-on-chip (SoC) including a processor, a first memory controller controlled by the processor, and a second memory controller controlled by the processor;
a first memory device including a first memory channel configured to operate in a first cache mode and communicate with the first memory controller, and a second memory channel configured to operate in a first memory mode and communicate with the first memory controller; and a second memory device configured to communicate with the second memory controller, wherein the first memory channel is further configured to, based on a command from the first memory controller, change an operation mode from the first cache mode to the first memory mode.

16. The electronic device of claim 15, wherein the first memory channel supports the first cache mode, a second cache mode, a third cache mode, a fourth cache mode, the first memory mode, a second memory mode, a third memory mode, a fourth memory mode, and a fifth memory mode, and wherein the first memory channel is further configured to, based on the command from the first memory controller, operate in one of the first to the fourth cache modes and the first to the fifth memory modes, wherein the first memory mode is a default mode, wherein the second memory mode is a high-speed memory mode, wherein the third memory mode is a low-latency memory mode, wherein the fourth memory mode is a low-power memory mode, wherein the fifth memory mode is an extreme low-power memory mode, wherein the first cache mode is a high-speed cache mode, wherein the second cache mode is a low-latency cache mode, wherein the third cache mode is a low-power cache mode, and wherein the fourth cache mode is an extreme low-power cache mode.

17. The electronic device of claim 15, wherein the first memory channel and the second memory channel are implemented to be asymmetrical with respect to each other, wherein the first memory channel supports both the first cache mode and the first memory mode, and wherein the second memory channel supports the first memory mode and does not support the first cache mode.

18. A method of operating an electronic device which includes a near-memory device, a far-memory device, and a system-on-chip (SoC) configured to communicate with the near-memory device and the far-memory device, the method comprising:

performing power-up of the near-memory device;

providing, by the SoC, a first mode register write (MRW) command indicating a first mode to a first memory channel, during the power-up;

providing, by the SoC, a second MRW command indicating a second mode different from the first mode to a second memory channel, during the power-up;

using the first memory channel, which is set to the first mode based on the first MRW command, as a cache memory;

using the second memory channel, which is set to the second mode based on the second MRW command, as a main memory; and changing an operation mode of the first memory channel used as the cache memory from the first mode to the second mode.

19. The method of claim 18, wherein the first mode uses a first power supply voltage, a first data clock of a first frequency magnification, and a first latency parameter of a first time magnification, wherein the second mode uses a second power supply voltage, a second data clock of a second frequency magnification, and a second latency parameter of a second time magnification, and wherein the first power supply voltage is different from the second power supply voltage, the first frequency magnification is different from the second frequency magnification, and/or the first time magnification is different from the second time magnification.

20. The method of claim 18, wherein the changing the operation mode of the first memory channel includes:

providing, by the SoC, a third MRW command indicating the second mode to the first memory channel; and changing, by a first mode register of the first memory channel, the operation mode of the first memory channel from the first mode to the second mode.

* * * * *